United States Patent
Wu et al.

(10) Patent No.: US 7,852,960 B2
(45) Date of Patent: Dec. 14, 2010

(54) METHOD OF COMPUTING PATH METRICS IN A HIGH-SPEED VITERBI DETECTOR AND RELATED APPARATUS THEREOF

(75) Inventors: Wen-Yi Wu, Hsin-Chu Hsien (TW); Meng-Ta Yang, Miao-Li Hsien (TW); Pi-Hai Liu, Taipei (TW)

(73) Assignee: Mediatek Incorporation, Science-Based Industrial Park, Hsin-Chu Hsien (TW)

( * ) Notice: Subject to any disclaimer, the term of this patent is extended or adjusted under 35 U.S.C. 154(b) by 1234 days.

(21) Appl. No.: 11/161,202

(22) Filed: Jul. 26, 2005

(65) Prior Publication Data

US 2006/0088118 A1    Apr. 27, 2006

(30) Foreign Application Priority Data

Oct. 21, 2004    (TW) ............................... 93132017 A

(51) Int. Cl.
*H04L 5/12*    (2006.01)

(52) U.S. Cl. .................. 375/262; 375/259; 375/260; 375/267; 375/306; 375/316; 714/792; 714/795; 714/796

(58) Field of Classification Search ............... 375/233, 375/262, 336, 341, 350, 136, 147, 260, 265, 375/259, 261, 355, 295, 299, 316, 220, 306, 375/342, 343; 714/792, 796
See application file for complete search history.

(56) References Cited

U.S. PATENT DOCUMENTS

| | | | |
|---|---|---|---|
| 4,612,659 A | 9/1986 | Starke | |
| 4,630,295 A | 12/1986 | Kamuro | |
| 5,799,046 A | 8/1998 | Hayashi | |
| 6,111,835 A | 8/2000 | Honma | |
| 6,532,337 B1 | 3/2003 | Yoshinaka | |
| 7,492,839 B2* | 2/2009 | Varma et al. ................. | 375/341 |
| 7,684,505 B2* | 3/2010 | Rajagopal et al. ........... | 375/265 |
| 2002/0094057 A1 | 7/2002 | Shibuya | |
| 2002/0122480 A1* | 9/2002 | Abnous et al. ............... | 375/233 |
| 2002/0174402 A1 | 11/2002 | Yamamoto | |
| 2003/0196163 A1* | 10/2003 | Chen et al. ................... | 714/795 |
| 2004/0044946 A1* | 3/2004 | Bickerstaff et al. .......... | 714/792 |
| 2004/0133843 A1* | 7/2004 | Yamakawa ................... | 714/794 |
| 2004/0153954 A1* | 8/2004 | Allen et al. .................. | 714/795 |
| 2004/0243914 A1* | 12/2004 | Noda ........................... | 714/792 |
| 2005/0149838 A1* | 7/2005 | Chiueh et al. ............... | 714/795 |
| 2005/0235193 A1* | 10/2005 | Cameron ..................... | 714/792 |
| 2006/0023814 A1* | 2/2006 | Varma et al. ................. | 375/336 |
| 2008/0072129 A1* | 3/2008 | Yamanaka et al. ........... | 714/796 |

* cited by examiner

*Primary Examiner*—Shuwang Liu
*Assistant Examiner*—Hirdepal Singh
(74) *Attorney, Agent, or Firm*—Winston Hsu; Scott Margo

(57) ABSTRACT

A path metric computing method applied in a high-speed Viterbi detector and related apparatus thereof are disclosed. The path metric computing apparatus includes a comparator for generating a control signal according a plurality of previous path metrics, a combining circuit for generating a plurality of first output values according to the previous path metrics and branch costs of a plurality of branches of a current state, and a multiplexer, electrically connected to the comparator and the combining circuit, for determining a first path metric of the current state according to the control signal and the output values.

29 Claims, 14 Drawing Sheets

METHOD OF COMPUTING PATH METRICS IN A HIGH-SPEED VITERBI DETECTOR AND RELATED APPARATUS THEREOF

BACKGROUND

The invention relates to a method of computing path metrics applied in a Viterbi detector and a related apparatus thereof, and more particularly, to a method of computing path metrics in a parallel processing manner and the related apparatus thereof.

In digital communication systems, the Maximum Likelihood Sequence Detection (MLSD) is a popular technique applied in numerous communication systems with different architectures. The Viterbi detector is a popular circuit utilizing the MLSD technique. As is well known in the art, Additive white Gaussian noise (AWGN) and many sources of interference exist in general communication channels. To reduce the error rate of signal detection, most communication systems encode the data and transmit the encoded data instead of transmitting the original data. The encoding procedure comprises convoluting the data according to a specific algorithm, where the number of bits of the encoded data is more than the original data. Before a receiver decodes the received data, the receiver determines the accuracy of the received data according to the specific algorithm. The specific algorithm is capable of restoring the incorrect received data.

Take the Viterbi Algorism (VA) as an example. Please refer to FIG. 1. FIG. 1 is a state diagram of the related art Viterbi Algorism having six states. As shown in FIG. 1, each state relates to a different input value (i.e., original data) and a corresponding output value (i.e., encoded signal), such as 6, 4, 2, 0, −2, −4, or −6. After the encoded signal is transmitted to the communication channel, the encoded signal may be affected by noise. Due to the encoded signal being disturbed, the signal receiver may determine the received encoded signal to be an incorrect value. For example, if an encoded signal equal to "6" is affected by interference, when the receiver receives the affected signal it will erroneously, the receiver determine the signal to be equal to "5". As can be seen from referring to FIG. 1, it is obvious that no encoded signal is equal to "5", therefore it is an incorrect signal. The receiver expects the encoded signal to be "6" or "4", but still needs an algorithm to restore the received encoded signal value to the original encoded signal value transmitted by the transmitter.

Please refer to FIG. 2. FIG. 2 is a related art Trellis tree diagram with an operation timing. The Trellis tree is established according to the state diagram shown in FIG. 1. The Trellis tree includes a plurality of states S0, S1, S3, S4, S6, S7, and a plurality of branches 11, 12, 13, 14, 15, 16, 17, 18, 19, 20 between states. Assuming the state S7 is the initial state, if a bit equal to "0" is received by the encoder, the encoder outputs a value equal to 4 and enters the state S6. Next, if a bit equal to "0" is received by the encoder, the encoder outputs a value "0" and enters the state S4. Additionally, the receiver restores the received signal to be a correct signal according to the Trellis tree. For example, assume the initial state is state S7 and the receiver receives an input signal equal to "2". The receiver computes a plurality of branch costs according to the input signal and the ideal encoded signal (i.e., equal to "6", "4" . . . etc). Next the receiver determines the correct value of the input signal through a plurality of path metrics P, generated according to the branch costs. Each path metric P is an accumulated result of a plurality of branch costs corresponding to different input timings. In practice, the branch costs are equal to the absolute value of the difference between the input signal and each ideal encoded signal. Hence, the operations of generating the path metrics of each state are represented by the following equations:

$$P_{S7} = \min\{(P_{S7}+B_{S7 \to S7}), (P_{S3}+B_{S3 \to S7})\} \quad \text{Equation (1)}$$

$$P_{S6} = \min\{(P_{S7}+B_{S7 \to S6}), (P_{S3}+B_{S3 \to S6})\} \quad \text{Equation (2)}$$

$$P_{S4} = P_{S6}+B_{S6 \to S4} \quad \text{Equation (3)}$$

$$P_{S3} = P_{S1}+B_{S1 \to S3} \quad \text{Equation (4)}$$

$$P_{S1} = \min\{(P_{S4}+B_{S4 \to S1}), (P_{S0}+B_{S0 \to S1})\} \quad \text{Equation (5)}$$

$$P_{S0} = \min\{(P_{S4}+B_{S4 \to S0}), (P_{S0}+B_{S0 \to S0})\} \quad \text{Equation (6)}$$

Since the operation of the Trellis tree diagram is well known to those skilled in the art, a detailed description is omitted for the sake of brevity. To explain entering the state $S_j$ from the state $S_i$ in an operation timing, the state $S_i$ is called a previous state, and the state $S_j$ is called a current state. In the next operation timing, the current state $S_j$ becomes one of the previous states. Therefore the current state is updated with each operation timing, and the path metric P of the current state is also updated with each input timing. In an ideal situation (i.e. without noise), there must be an optimum path metric in the path metrics P of each current state. Based on the method of generating the branch cost mentioned above, the value of the optimum path metric is equal to zero. The path of the optimum path metric relates to correct encoded signals. However, if no path metrics are equal to zero, the input signal is affected by noise. As a result, the minimum path metric is determined to be the optimum path metric and then the encoded signal is determined in the same manner.

Please refer to FIG. 3. FIG. 3 is a schematic diagram of a related art path metric computing unit 10. As shown in FIG. 3, the path metric computing unit 10 comprises a plurality of adders 21, 23, a comparator 25, a multiplexer 27, and a register 29. Take the operation of the path metric $P_{S7}$ and the path metric $P_{S3}$ as an example in the following description. Firstly, the adder 21 adds a path metric $P_{S7}$ of a previous state S7 to a corresponding branch cost $B_{S7 \to S7}$, and the adder 23 adds a path metric $P_{S3}$ of a previous state S3 to a corresponding branch cost $B_{S3 \to S7}$. Secondly, the comparator 25 compares the output values of the adders 21, 23, and outputs a control signal Sc to the multiplexer 27 according to the comparison result. Thirdly, the multiplexer 27 selects the smaller of the two input values according to the control signal Sc to be the path metric $P_{S7}$ of the current state S7. Since other path metric computing units have the same architecture as the architecture of the path metric computing unit 10, and they compute the path metrics in the same manner, a detailed description of other path metric computing units is omitted. However, the architectures of path metric computing units mentioned above are not appropriate when the input data transfer rate is huge. A related method for processing a lot of input data in an operation timing is to increase the complexity of the circuits of path metric computing units. Hence, the manufacturing cost and difficulties increase accordingly.

SUMMARY

It is therefore one objective of the present invention to provide a path metric computing method with a parallel operation architecture and related apparatus to solve the above-mentioned problem.

According to the present invention, a path metric computing unit applied in a Viterbi detector is disclosed. The path metric computing unit is utilized to generate a first path metric according to a plurality of previous path metrics and a first branch cost. As the Viterbi detector receives an input signal, it generates a detection result based on the input signal, and computes the first branch cost according to at least two input signals corresponding to at least two input timings. The path metric computing unit comprises: a comparator for generating a control signal according to a plurality of previous path metrics, wherein the control signal corresponds to the best of the previous path metrics; a first combination circuit for generating a plurality of first candidate path metrics according to each previous path metric and the first branch cost; and a first multiplexer, electrically connected to the comparator and the first combinational circuit, for determining the first path metric according to the control signal and the first candidate path metrics.

According to the present invention, a Viterbi detector is disclosed. The Viterbi detector is utilized to process m input bits in an operation timing, wherein m>=1. The Viterbi detector comprises: a path metric computing unit for computing a path metric of a current state and for generating a control signal; and a survival path memory unit for storing a survival path corresponding to the current state, wherein m latest bits of the survival path corresponds to the control signal.

According to the present invention, a Viterbi detector is disclosed. The Viterbi detector is utilized to process m input bits at a single input timing, wherein m>=1. The Viterbi detector comprises: a first branch cost computing unit (BMU) for computing a first branch cost of a current state; a second branch cost computing unit for computing a second branch cost of the current state; a first path metric computing unit, electrically connected to the first branch cost computing unit, for generating a first path metric of the current state according to a plurality of previous path metrics corresponding to current state and the first branch cost; a second path metric computing unit, electrically connected to the second branch cost computing unit, for generating a second path metric of the current state according to the plurality of previous path metrics and the second branch cost; and a survival path memory unit (SMU) for storing a survival path corresponding to the current state; wherein the length of a related input signal for calculating the first and the second branch costs at a single operation timing is q input timings, and q is greater than m.

According to the present invention, a path metric computing method applied in a Viterbi detector is disclosed. The path metric computing method generates a first path metric according to a plurality of previous path metrics and a first branch cost. When the Viterbi detector receives an input signal, it generates a detecting result based on the input signal, and computes the first branch cost according to at least two input signals corresponding to at least two input timings. The path metric computing method comprises: generating a control signal by comparing a plurality of previous path metrics, wherein the control signal corresponds to the best of the previous path metrics; generating a plurality of first candidate path metrics according to the previous path metric and the first branch cost; and determining the first path metric according to the control signal and the first candidate path metrics.

According to the present invention, a Viterbi detecting method is disclosed. The Viterbi detecting method processes m input bits in an operation timing, wherein m>=1. The Viterbi detecting method comprises: computing a path metric corresponding to a current state and a control signal; and updating a survival path of the current state according to the control signal; wherein m latest bits of the survival path corresponds to the control signal.

According to the present invention, a Viterbi detecting method is disclosed. The Viterbi detecting method processes m input bits in an operation timing, wherein m>=1. The Viterbi detecting method comprises: computing a first branch cost of a current state; computing a second branch cost of the current state; generating a first path metric of the current state according to a plurality of previous path metrics corresponding to current state and the first branch cost; generating a second path metric of the current state according to the plurality of previous path metrics and the second branch cost; and generating and storing a survival path corresponding to the current state; wherein a length of a related input signal for calculating the first and the second branch costs at a single operation timing is q input timings, and q is greater than m.

According to the present invention, the path metric computing unit utilizes a parallel operation architecture to raise the computation speed without increasing the circuit complexity. As a result, the path metric computing unit is easier to implement than the related art, and the manufacturing cost is reduced too.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
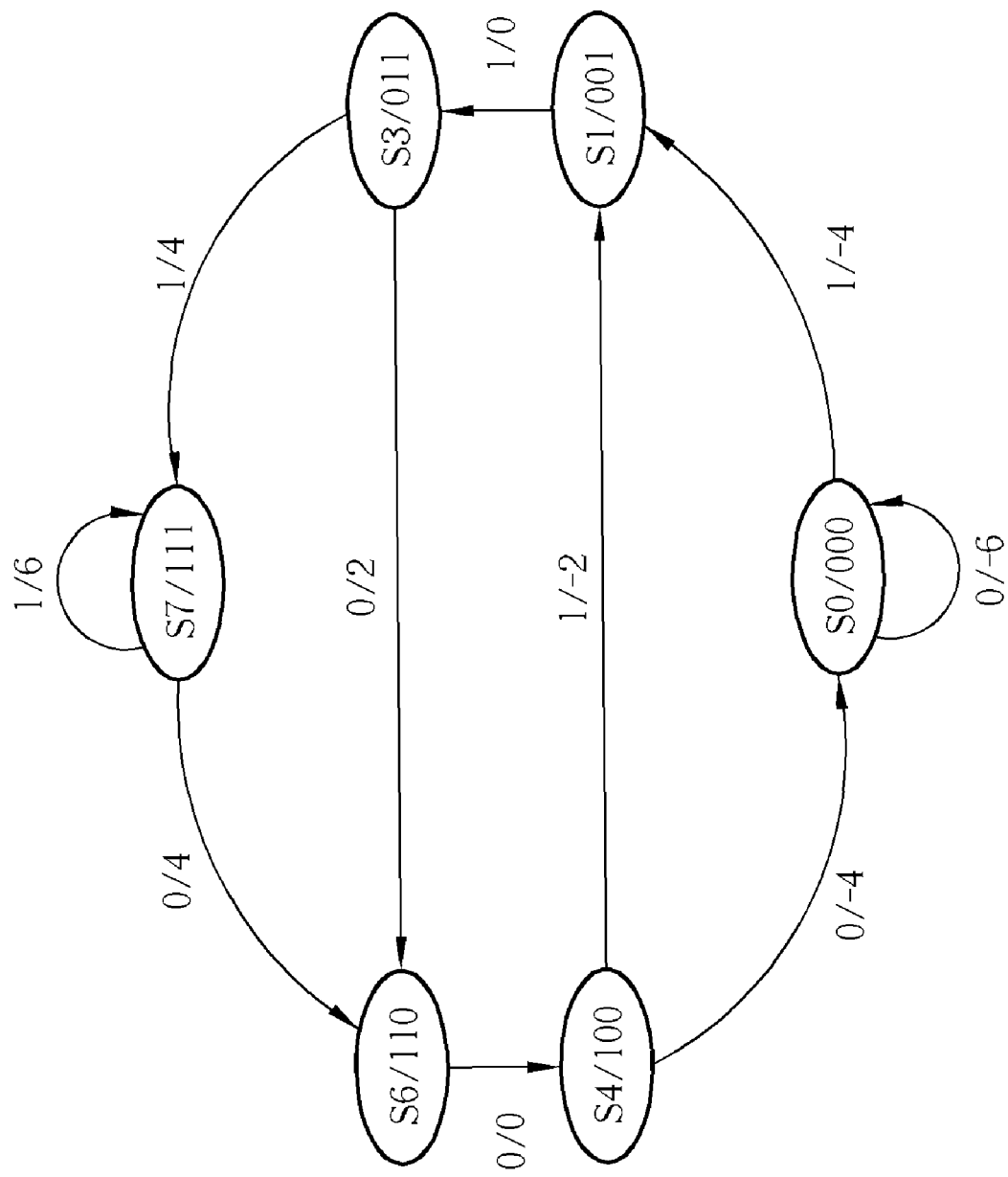
FIG. 1 is a state diagram of the related art Viterbi Algorism having six states.
Figure 2:
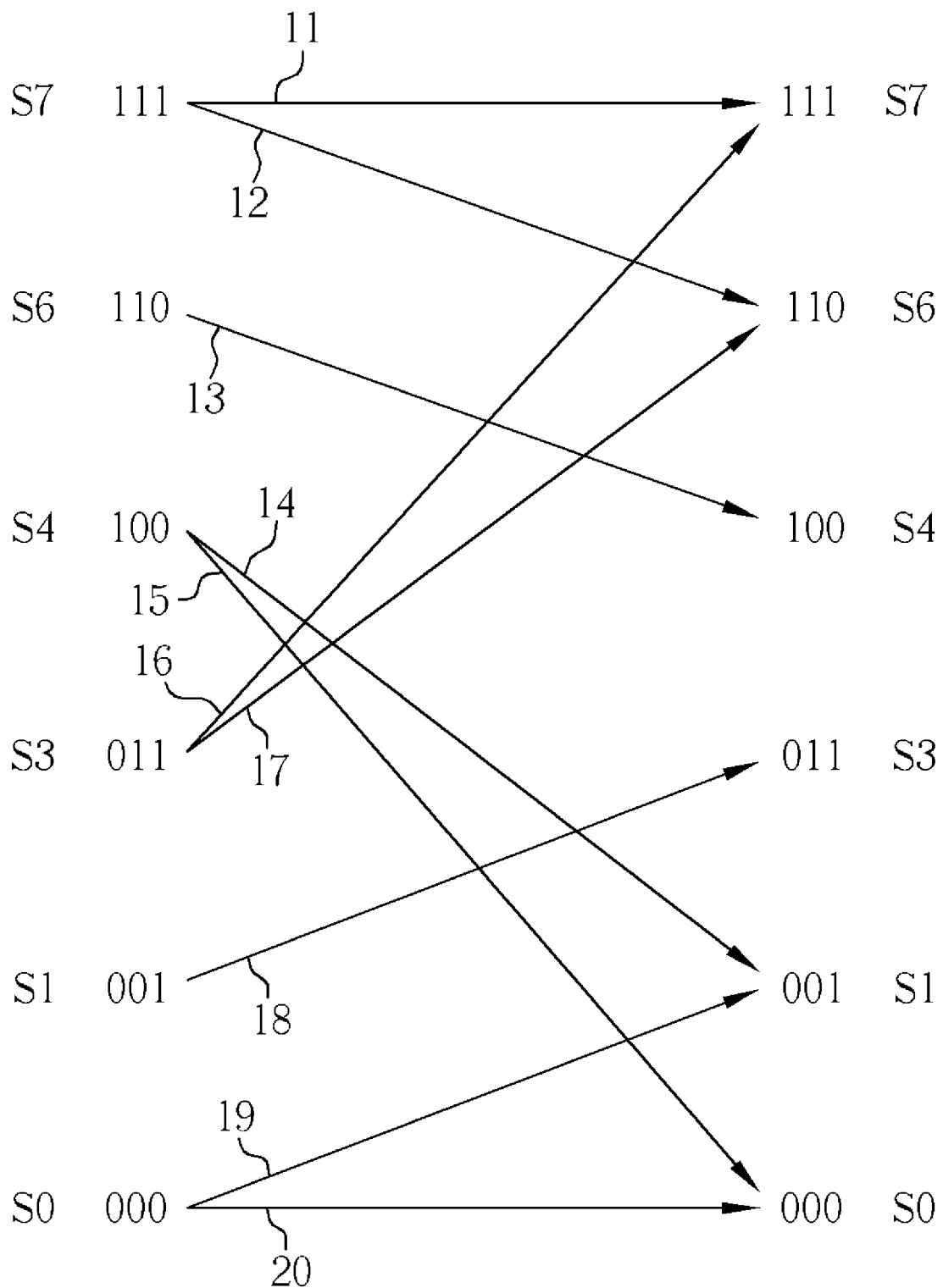
FIG. 2 is a related art Trellis tree diagram with an operation timing.
Figure 3:
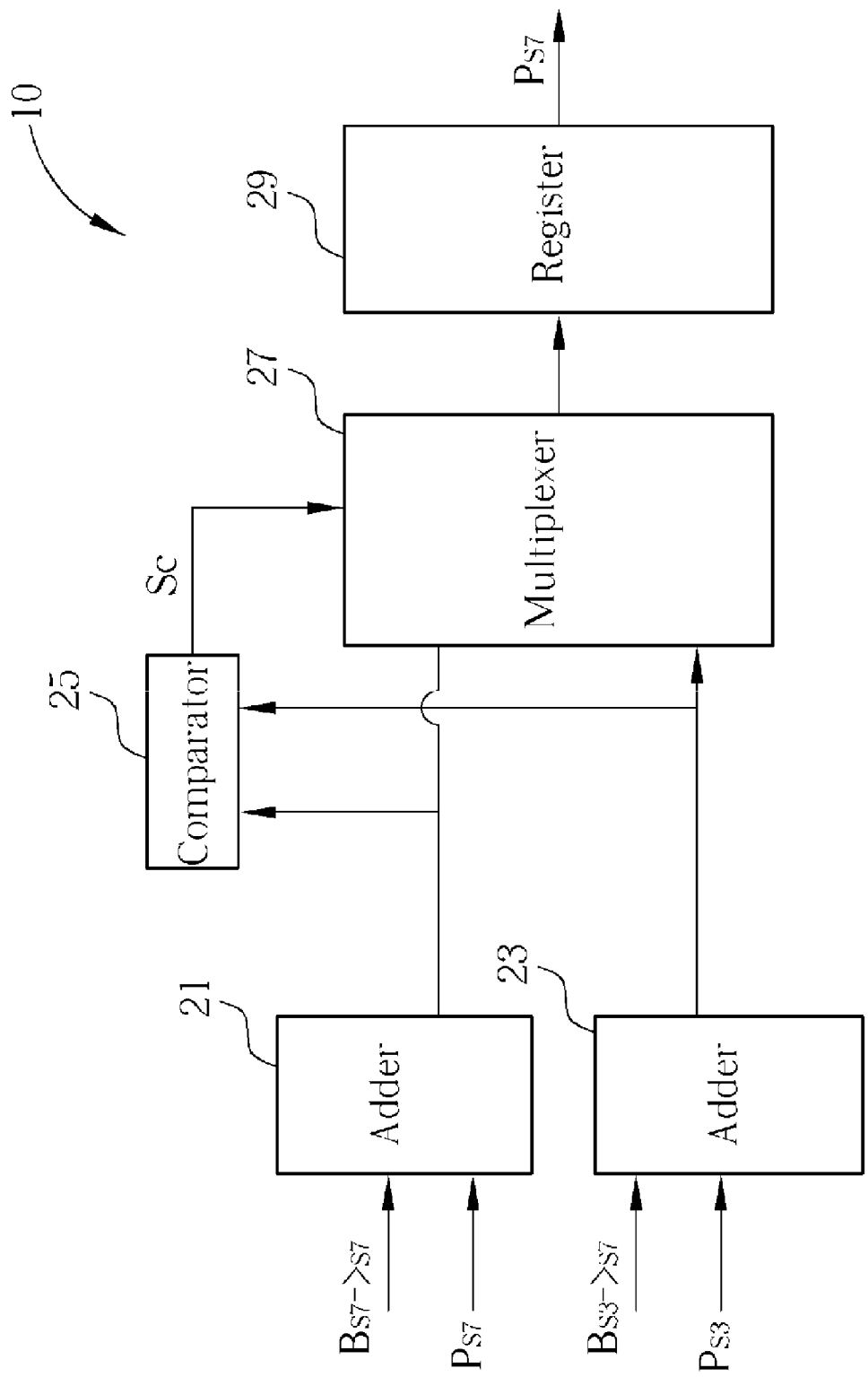
FIG. 3 is a schematic diagram of a related art path metric computing unit.
Figure 4:
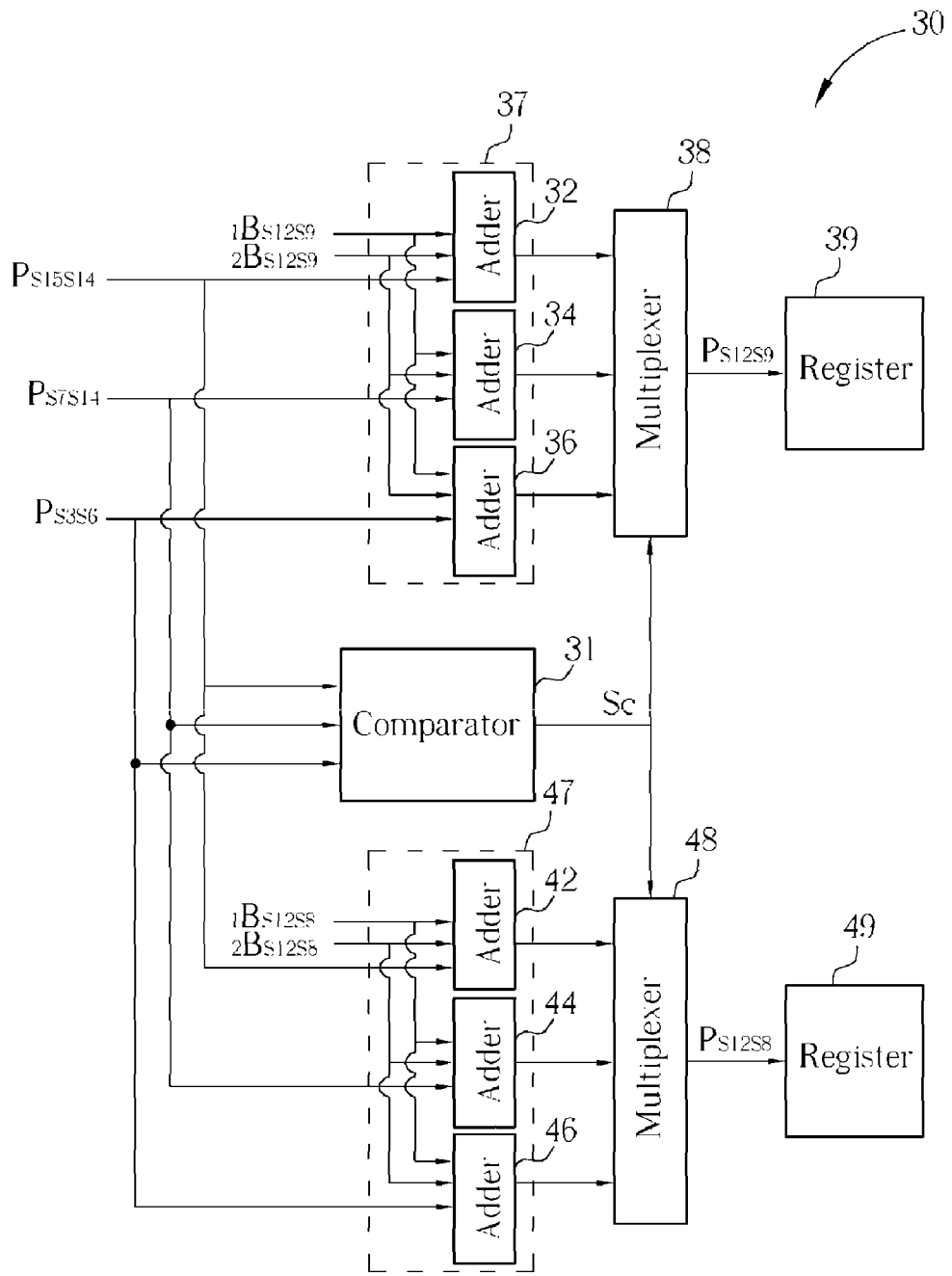
FIG. 4 is a schematic diagram of the path metric computing unit according to the first embodiment of the present invention.
Figure 5:
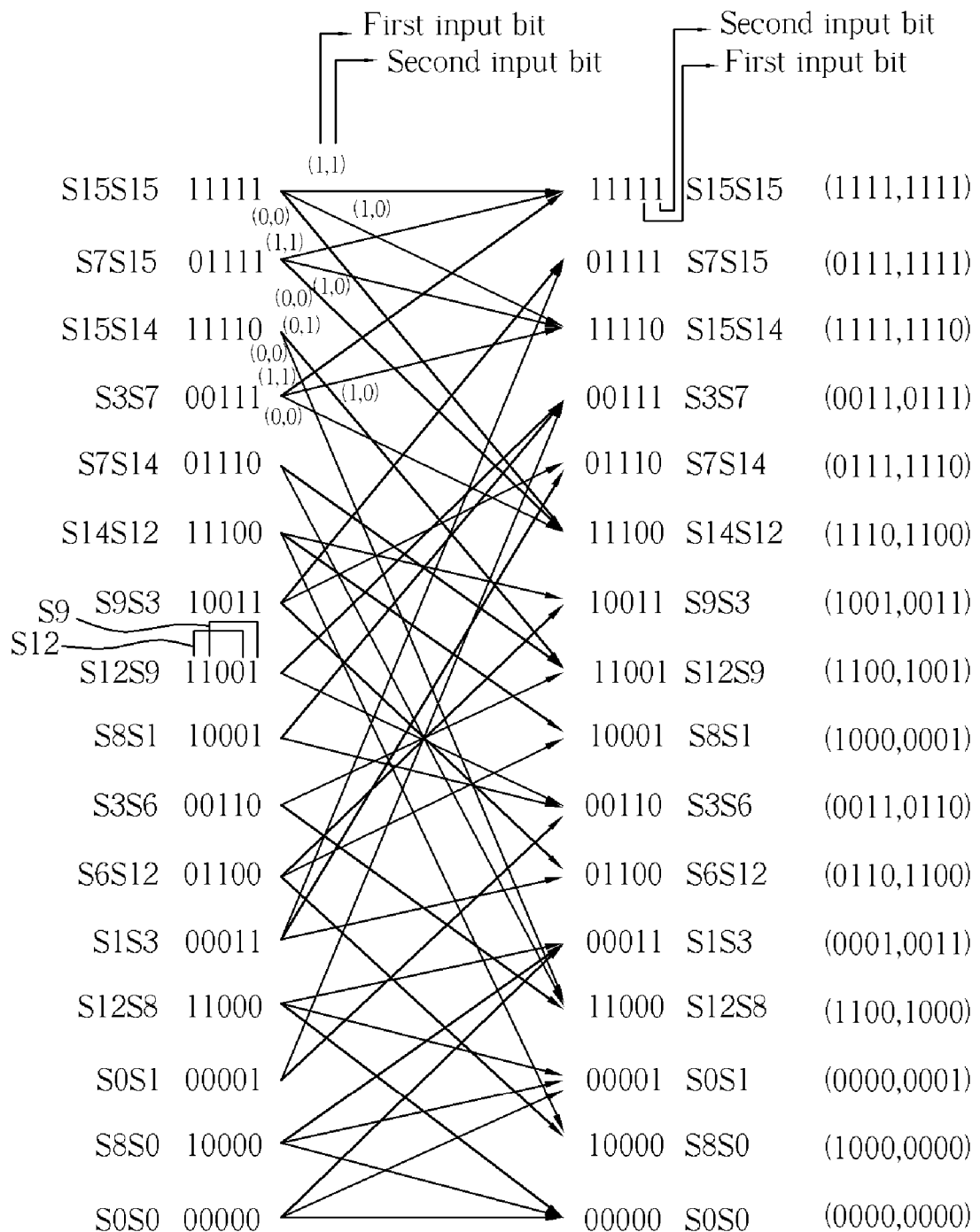
FIG. 5 is a Trellis tree diagram utilized by the path metric computing unit shown in FIG. 4.

Please refer to FIG. 4 and FIG. 5. FIG. 4 is a schematic diagram of the path metric computing unit 30 according to the first embodiment of the present invention. FIG. 5 is a Trellis tree diagram utilized by the path metric computing unit 30 shown in FIG. 4. In FIG. 5, two stages of a related art Trellis tree diagram are combined into one stage. In other words, the path metric computing unit 30 processes two input bits in an operation timing. Take the current state S12S9 as an example. The name of the current state S12S9 is represented by bits "11001". The first four bits "1100" represent the name of the state S12, and the last four bits "1001" represent the name of the state S9. In addition, the current state S12S9 corresponds to three previous states S15S14, S7S14, and S3S6. For example, if the previous state is S15S14, S7S14, or S3S6, and the input bits are "01", the current state is S12S9 according to the Trellis tree diagram shown in FIG. 5. In the same manner, if the previous state is S15S14, S7S14, or S3S6, and input bits are "00", the current state is S12S8. Please note that if the input bits of specific previous states are the same, then the corresponding current states of the specific previous states are the same. This is because the Trellis tree diagram of Moore state machine has a property that the output of the Moore state machine only depends on the current state, and is independent to the input bits. Therefore, as every previous state corresponding to the same current state has the same input bits, the branch costs corresponding to each previous state are the same. According to the property mentioned above, the path metric computing unit 30 is capable of comparing the plurality of path metrics of previous states (i.e., the previous path metrics) and adding each previous path metric to the corresponding branch cost at the same time. As a result, the path metric computing unit 30 saves more time than the related art path metric computing unit.

Please refer to FIG. 4. The path metric computing unit 30 is utilized to compute the path metrics of the current state S12S9 (11001) and S12S8 (11000). The path metric computing unit 30 comprises a comparator 31, a combinational circuit 37, a multiplexer 38, and a register 39. The comparator 31 compares the path metrics of the previous states S15S14, S7S14, and S3S6, and generates a control signal Sc according to the comparison result. The combinational circuit 37 comprises a plurality of adders 32, 34, 36. The adders 32, 34, 36 respectively add the path metrics $P_{S15S14}$, $P_{S7S14}$, $P_{S3S6}$ of previous states S15S14, S7S14, S3S6 to the branch costs $_1B_{S12S9}$ and $_2B_{S12S9}$ to generate the plurality of output values. The multiplexer 38 selects the minimum output value of the adders 32, 34, 36 according to the control signal Sc. The register 39 memorizes the minimum output value as the path metric $P_{S12S9}$ of the current state S12S9. As shown in FIG. 4, the path metric computing unit 30 further comprises a combinational circuit 47, a multiplexer 48, and a register 49. The combinational circuit 47 comprises a plurality of adders 42, 44, 46, which respectively add the path metrics $P_{S15S14}$, $P_{S7S14}$, $P_{S3S6}$ of the previous states S15S14, S7S14, S3S6 to the branch costs $_1B_{S12S8}$, and $_2B_{S12S8}$ to generate a plurality of output values. Then, the multiplexer 48 selects the minimum output value of the adders 42, 44, 46 according to the control signal Sc. The register 49 memorizes the minimum output value as the path metric $P_{S12S8}$ of the current state S12S8. The operations of the path metric computing unit 30 are represented by the following equations:

$$P_{S12S9}=\min\{P_{S1S14},P_{S7S14},P_{S3S6}\}+_1B_{S12S9}+_2B_{S12S9}; \quad \text{Equation (7)}$$

$$P_{S12S8}=\min\{P_{S15S14},P_{S7S14},P_{S3S6}\}+_1B_{S12S8}+_2B_{S12S8}; \quad \text{Equation (8)}$$

Please note that only one comparator is applied in the path metric computing unit 30; in other words the combinational circuits 37 and 47 share the control signal Sc generated by the comparator 31. The multiplexers 38, 48 are driven to generate the correct path metrics $P_{S12S8}$, and $P_{S12S9}$ according to the control signal Sc. Finally, when the path metric computing unit 30 receives the next two bits in the next operation timing, the path metric computing unit 30 records the left two bits of the previous state, which correspond to the minimum path metric, in a related art survival path memory unit (SMU). Please note that each current state corresponds to a survival path. Since the survival paths of the current states S12S9 and S12S8 are the same, only one memory unit is utilized to memorize the survival path of the current states S12S9 and S12S8. Other previous states corresponding to the same current state can share a memory unit, so as to save the memory utilized. As a result, compared with the related art, the computation time, the circuit complexity, and the memory requirement of the path metric computing unit are reduced according to the present invention.

Figure 6:
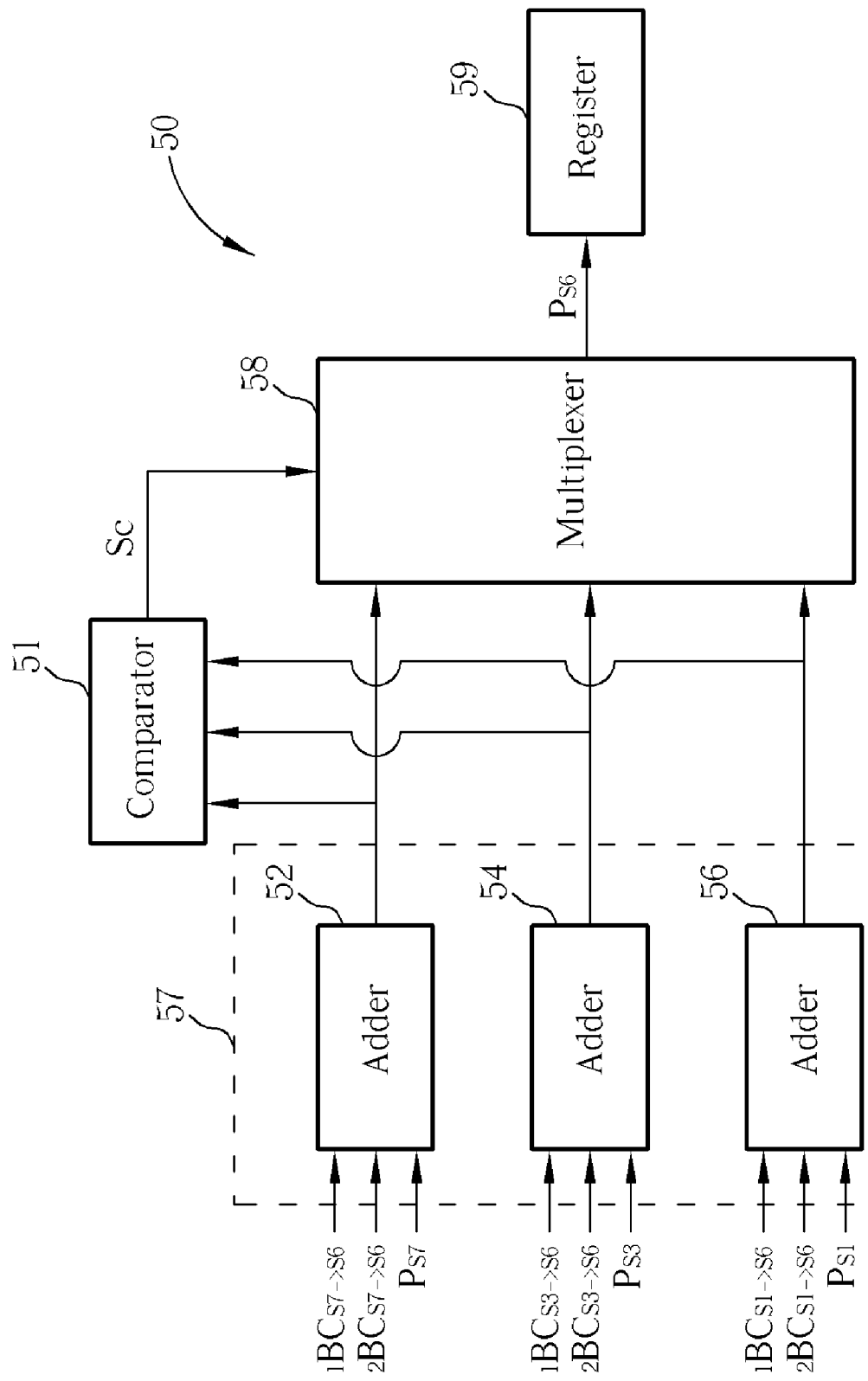
FIG. 6 is a schematic diagram of path metric computing unit according to a second embodiment of the present invention.
Figure 7:
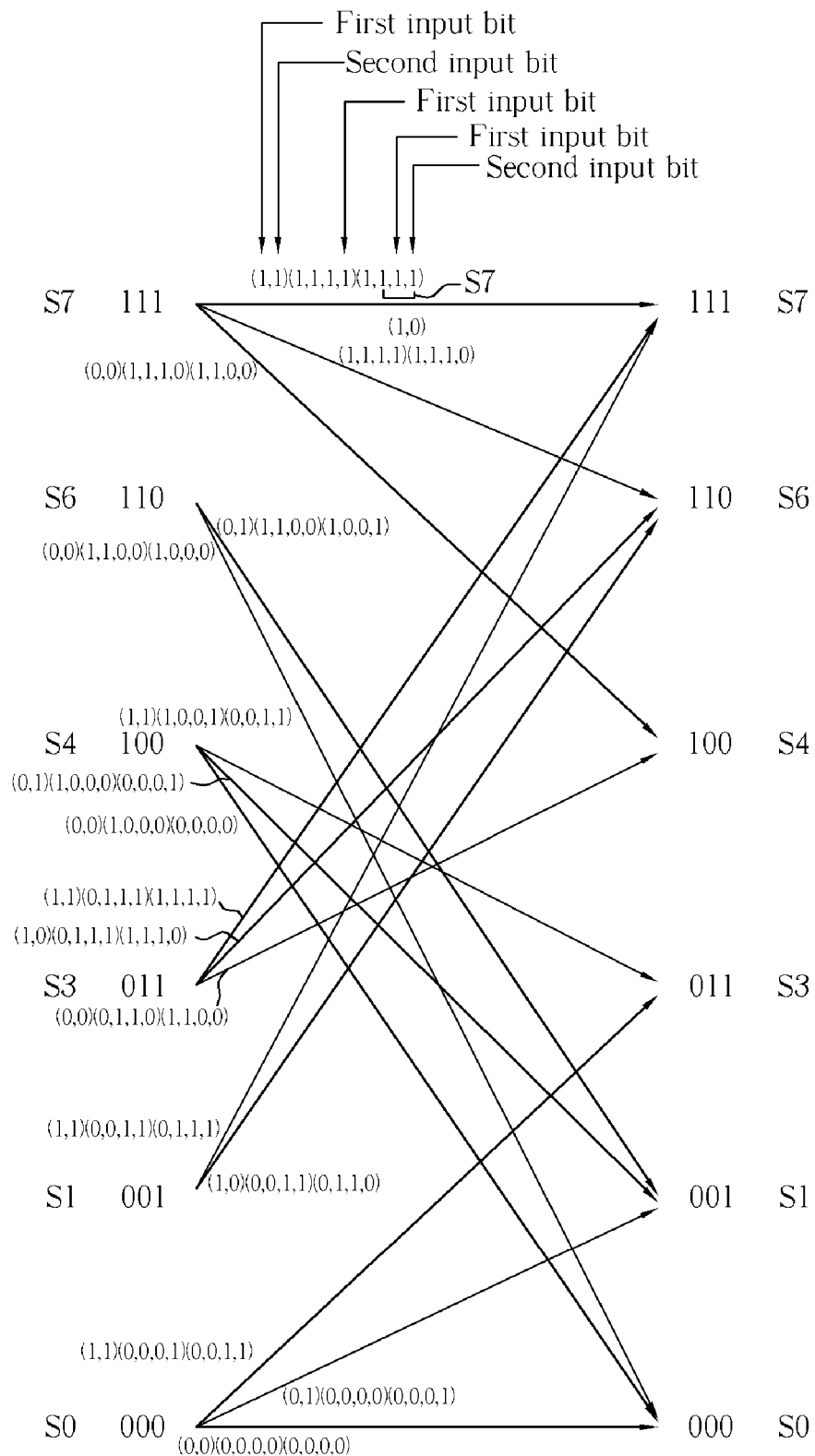
FIG. 7 is the Trellis tree diagram according to the Mealy state machine.

Please refer to FIG. 6 and FIG. 7. FIG. 6 is a schematic diagram of path metric computing unit 50 according to a second embodiment of the present invention. FIG. 7 is the Trellis tree diagram according to the Mealy state machine utilized by the path metric computing unit 50. Compared with the Moore state machine, the Mealy state machine also processes two input bits in an operation timing, but the Mealy state machine does not have the property that each current state only relates to one set of input bits. As a result, the number of states and the length of the corresponding bit streams of each state are reduced. Accordingly, the circuit complexity of the Mealy state machine is reduced. However, since the Mealy state machine cannot perform the adding and comparing procedure at the same time without the property mentioned above, the computation time of the Mealy state machine increases. In order to fix this drawback, the present invention adopts a retiming technique. The related description is detailed in the following paragraphs.

The path metric computing unit 50 comprises a comparator 51, a combinational circuit 57, a multiplexer 58, and a register 59. The combinational circuit 57 comprises a plurality of adders 52, 54, 56, and the operation of the combinational circuit 57 is the same as operations of the combinational circuit 37, 47 shown in FIG. 5. To explain the key feature of the present invention, the path metric computing unit 50 is only utilized to compute the path metric of the current state S6. The adder 52 adds the path metric $P_{S7}$ of the previous states S7 to the corresponding branch cost $_1BC_{S7->S6}$ and $_2BC_{S7->S6}$; the adder 54 adds the path metric $P_{S3}$ of the previous states S3 to the corresponding branch cost $_1BC_{S3->S62}$ and $_2BC_{S3->S6}$; and the adder 56 adds the path metric $P_{S1}$ of the previous states S1 to the corresponding branch cost $_1BC_{S1->S6}$ and $_2BC_{S1->S6}$. The comparator 51 compares the output values of the adders 52, 54, 56, and outputs a control signal Sc to the multiplexer 58 according to the comparison result. The multiplexer 58 selects the minimum output value of the adders 52, 54, 56 according to the control signal Sc. The selected output value is determined to be the path metric $P_{S6}$ of the current state S6. The operations of the path metric computing unit 50 are represented by the following equation:

$$P_{S6}=\min\{(P_{S7}+_1BC_{S7->S6}+_2BC_{S7->S6}),(P_{S3}+_1BC_{S3->S6}+_2BC_{S3->S6}),(P_{S1}+_1BC_{S1->S6}+_2BC_{S1->S6})\} \quad \text{Equation (9)}$$

Figure 8:
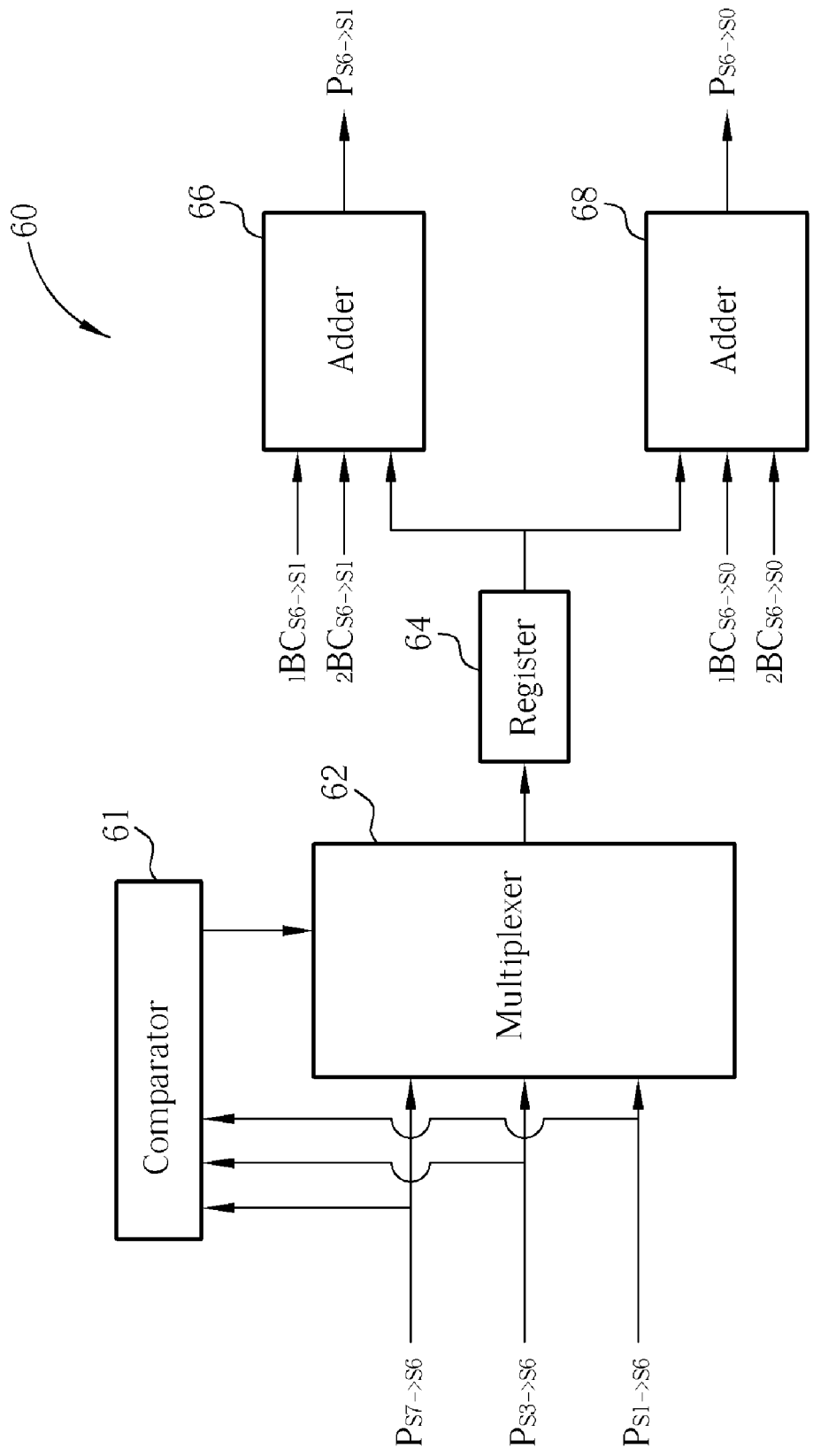
FIG. 8 is a schematic diagram of the path metric computing unit adopting a retiming technique according to a third embodiment of the present invention.

To reduce the computation time of the path metric computing unit 50, the retiming technique is applied in the present invention. Please refer to FIG. 7 and FIG. 8. FIG. 8 is a schematic diagram of the path metric computing unit 60 with the retiming technique according to a third embodiment of the present invention. The path metric computing unit 60 comprises a comparator 61, a multiplexer 62, a register 64, and a plurality of multiplexers 66, 68. Please note that only the operations of generating the path metrics $P_{S6->S1}$ and $P_{S6->S0}$ are shown in FIG. 8 for the sake of brevity. Please also refer to FIG. 7. The previous states shown in FIG. 8 are S7->S6, S3->S6, and S1->S6, and the corresponding path metrics are $P_{S7->S6}$, $P_{S3->S6}$, and $P_{S1->S6}$ expressed as:

$$P_{S7->S6} = P_{S7} + {}_1BC_{S7->S6} + {}_2BC_{S7->S6} \quad \text{Equation (10)}$$

$$P_{S3->S6} = P_{S3} + {}_1BC_{S3->S6} + {}_2BC_{S3->S6} \quad \text{Equation (11)}$$

$$P_{S1->S6} = P_{S1} + {}_1BC_{S1->S6} + {}_2BC_{S1->S6} \quad \text{Equation (12)}$$

As the current states are S6->S1, S6->S0, the corresponding branch costs are ${}_1BC_{S6->S1}$, ${}_2BC_{S6->S1}$, ${}_1BC_{S6->S0}$, and ${}_2BC_{S6->S0}$. According to the amendment, the path metrics $P_{S7->S6}$, $P_{S3->S6}$, and $P_{S1->S6}$ of the previous states S7->S6, S3->S6, and S1->S6 are compared by the comparator 61. Next, the adders 66, 68 respectively add the path metrics $P_{S7->S6}$, $P_{S3->S6}$, and $P_{S1->S6}$ of the previous states S7->S6, S3->S6, and S1->S6 to the corresponding branch costs. As shown in FIG. 8, the comparator 61 compares the path metrics $P_{S7->S6}$, $P_{S3->S6}$, and $P_{S1->S6}$, and outputs a control signal Sc to the multiplexer 62 according to the comparison result. Next, the multiplexer 62 selects a minimum path metric according to the control signal Sc. Next, the register 64 records the minimum path metric. Finally, the adder 66 generates the path metric $P_{S6->S1}$ of the current state S6->S1 by adding the minimum path metric to the branch cost ${}_1BC_{S6->S1}$ and ${}_2BC_{S6->S11}$. The adder 68 generates the path metric $P_{S6->S0}$ of the current state S6->S0 by adding the minimum path metric to the $BC_{S6->S0}$ and ${}_2BC_{S6->S0}$.

Figure 9:
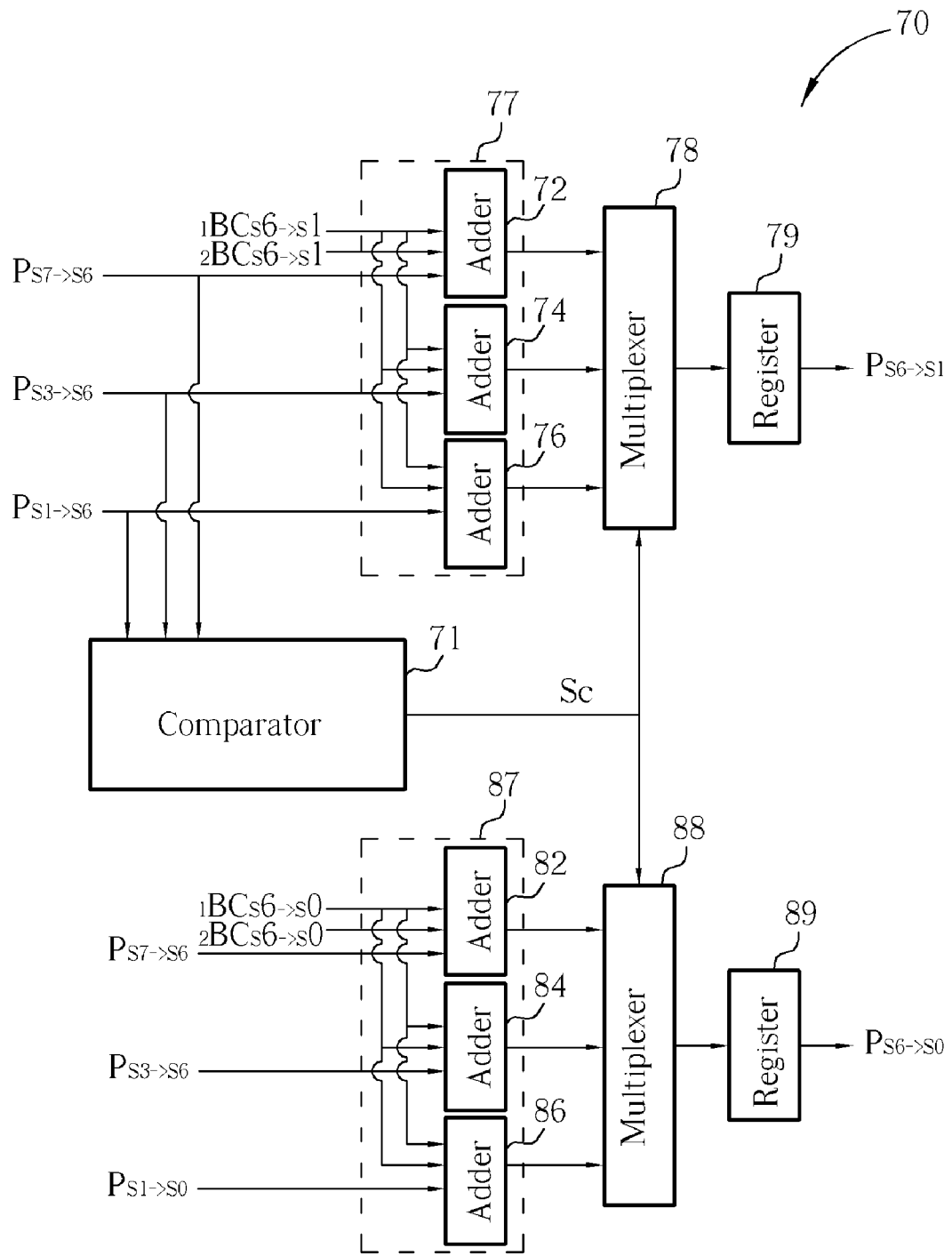
FIG. 9 is a schematic diagram of the path metric computing unit adopting a retiming technique according to a fourth embodiment of the present invention.

Please refer to FIG. 9. FIG. 9 is a schematic diagram of the path metric computing unit 70 adopting the retiming technique according to a fourth embodiment of the present invention. The path metric computing unit 70 also utilizes the Trellis diagram shown in FIG. 7, and is a modification of the path metric computing unit 60 shown in FIG. 8. The adders 66, 68 of the path metric computing unit 70 are placed before the multiplexer 62 to save computation time. Please note that the path metric computing unit 70 only generates the path metrics $P_{S6->S1}$ and $P_{S6->S0}$, so the description of other path metric computing units is omitted for the sake of brevity. The path metric computing unit 70 comprises a comparator 71, a plurality of combinational circuits 77, 87, a plurality of multiplexers 78, 88, and a plurality of registers 79, 89. The comparator 71 compares the path metrics $P_{S7->S6}$, $P_{S3->S6}$, $P_{S1->S6}$ of the previous states S7->S6, S3->S6, S1->S6, and outputs a control signal Sc to the multiplexers 78, 88 according to the comparison result. The combinational circuit 77 comprises a plurality of adders 72, 74, 76, which respectively add the path metrics $P_{S7->S6}$, $P_{S3->S6}$, $P_{S1->S6}$ to the branch costs ${}_1BC_{S6->S1}$ and ${}_2BC_{S6->S1}$ to generate a plurality of output values. The multiplexer 78 selects the minimum output value of the adders 72, 74, 76 according to the control signal Sc. The minimum output value is determined to be the path metric $P_{S6->S}$ of the current state S6->S1. In addition, the combinational circuit 87 comprises a plurality of adders 82, 84, 86 respectively adding the path metrics $P_{S7->S6}$, $P_{S3->S6}$, $P_{S1->S6}$ to the branch costs ${}_1BC_{S6->S0}$ and ${}_2BC_{S6->S0}$ to generate a plurality of output values. In the present embodiment, the multiplexer 88 also selects the minimum output value of the adders 82, 84, 86 according to the control signal Sc. The minimum output value is determined to be the path metric $P_{S6->S0}$ of the current state S6->S0. Finally, the registers 79, 89 record the calculated path metrics $P_{S6->S1}$ and $P_{S6->S0}$.

Figure 10:
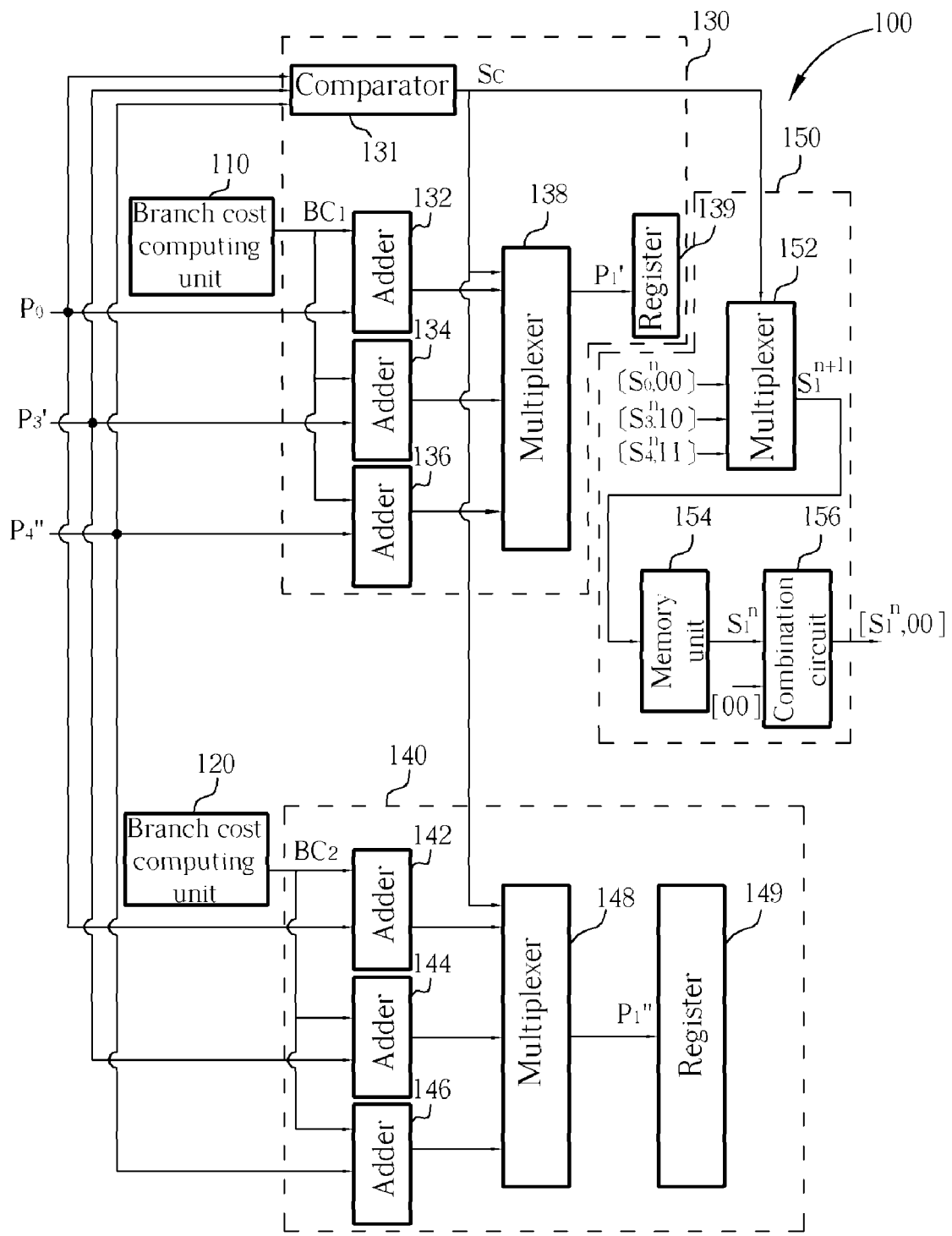
FIG. 10 is a schematic diagram of the fast Viterbi detector according to a preferred embodiment of the present invention.
Figure 11:
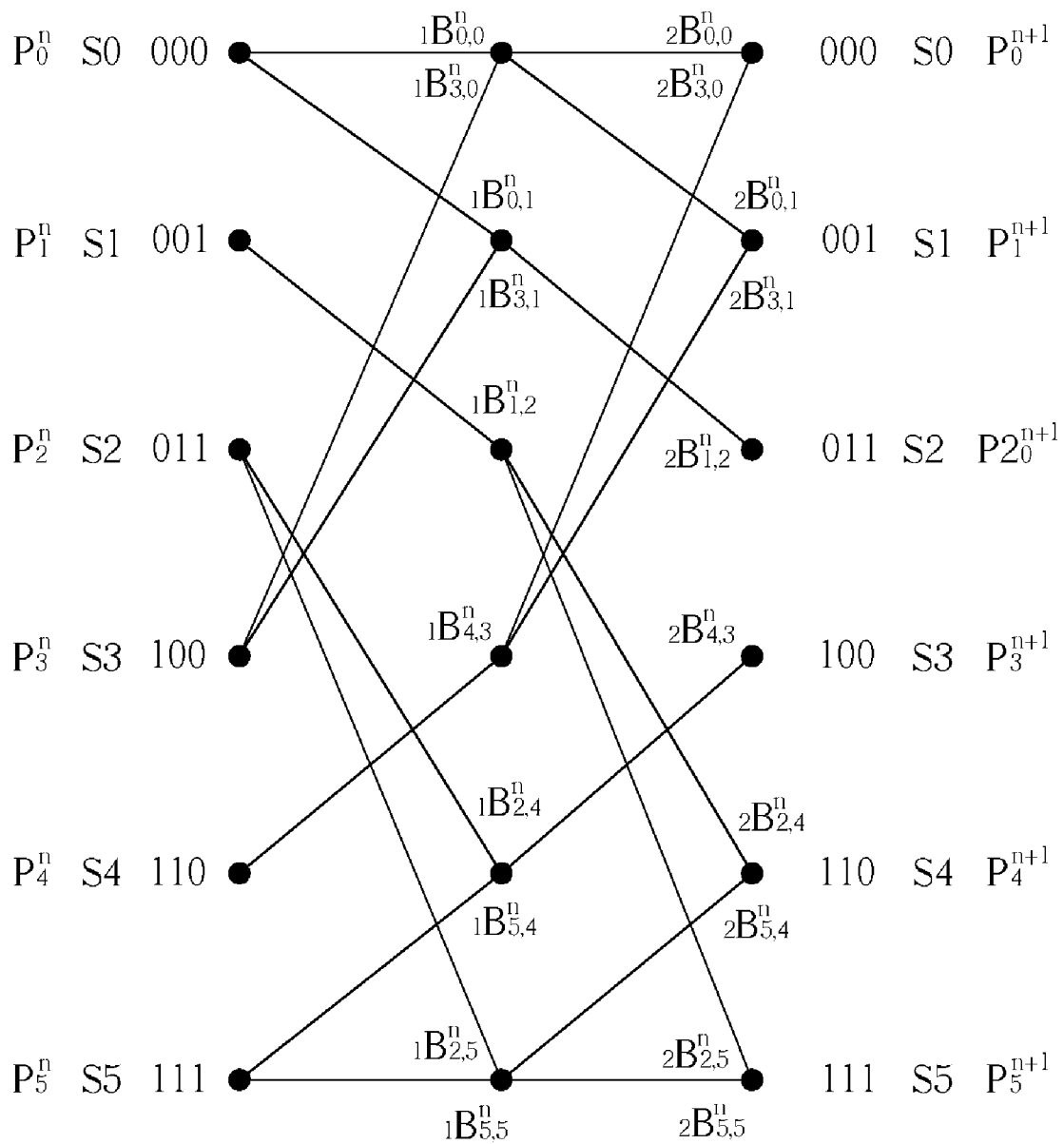
FIG. 11 is the Trellis diagram utilized by the fast Viterbi detector shown in FIG. 10.

Please refer to FIG. 10 and FIG. 11. FIG. 10 is a schematic diagram of the fast Viterbi detector 100 according to a preferred embodiment of the present invention. FIG. 11 is the Trellis diagram utilized by the fast Viterbi detector 100. The fast Viterbi detector 100 comprises a plurality of branch cost computing units 110, 120, a plurality of path metric computing units 130, 140, and a survival path memory unit 150. Firstly, the branch cost computing units 110, 120 respectively calculate the branch cost $BC_1$ and the branch cost $BC_2$. Secondly, the path metric computing unit 130 generates the path metric $P_{1'}$ according to the branch cost $BC_1$ and the previous path metrics $P_0$, $P_{3'}$, $P_{4'''}$. The path metric computing unit 140 generates the path metric $P_{1''}$ according to the branch cost $BC_2$ and the previous path metrics $P_0$, $P_{3'}$, $P_{4'''}$. Finally, the survival path memory unit 150 selects a survival path $S_1$ from the survival paths $[S_0,00]$, $[S_3,10]$, and $[S_4,11]$ according to the control signal Sc outputted from the path metric computing unit 130. The survival path $S_1$ is utilized as a candidate survival path in the next operation timing, and comprises a candidate survival path (i.e., a survival path in the last operation timing) and corresponding input bits. In the present embodiment, the input bits corresponding to the survival path $S_0$ are "00"; the input bits corresponding to the survival path $S_3$ are "10"; and the input bits corresponding to the survival path $S_4$ are "11". Since the method of generating the survival paths $S_0 \sim S_5$ is the same as the method of generating the survival path $S_1$ according to the present invention, a detailed description of the method for generating other survival paths is omitted for the sake of brevity. Hence, the following description only takes the survival path $S_1$ as an example.

Please refer to FIG. 10. As shown in FIG. 10, the path metric computing unit 130 further comprises a comparator 131, a plurality of adders 132, 134, 136, a multiplexer 138, and a register 139. The path metric computing unit 140 comprises a plurality of adders 142, 144, 146, a multiplexer 148, and a register 149. Since the functions and architectures of the components mentioned above are the same as the components having the same names, a detailed description of components mentioned above is omitted. The survival path memory unit 150 comprises a multiplexer 152, a memory unit 154, and a combinational circuit 156. Firstly, the multiplexer 152 receives the survival path $S_0$ of a previous state S0 and the corresponding input bits "00", the survival path $S_3$ of a previous state S3 of and the corresponding input bits "10", and the survival path $S_4$ of a previous state $S_4$ and the corresponding input bits "11", wherein each survival path of a previous state and the corresponding input bits construct a candidate survival path. Next, the multiplexer 152 selects a survival path from these candidate survival paths corresponding to the least path metric according to the control signal Sc. The operation of the multiplexer 152 is represented by the following equation:

$$S_1^{n+1} = \begin{cases} [S_0^n, 00], & \text{if } P_0^n = \min(P_0^n, P_{3'}^n, P_{4''}^n) \\ [S_3^n, 10], & \text{if } P_{3'}^n = \min(P_0^n, P_{3'}^n, P_{4''}^n) \\ [S_4^n, 11], & \text{if } P_{4''}^n = \min(P_0^n, P_{3'}^n, P_{4''}^n) \end{cases} \quad \text{Equation (13)}$$

wherein $[S_0^n, 00]$ denotes a candidate survival path comprising the survival path $S_0^n$ of the previous state S0 in the n-th operation timing and the input bits "00" following the survival path $S_0^n$; $[S_3^n, 10]$ denotes a candidate survival path comprising the survival path $S_3^n$ of the previous state S3 in the n-th operation timing and the input bits "10" following the survival path $S_3^n$; and $[S_4^n, 11]$ denotes a candidate survival path comprising the survival path $S_4^n$ of the previous state S4 in the n-th operation timing and the input bits "11" following the survival path $S_4^n$. Please note that the Viterbi detector 100 further comprises other survival path computing units for generating other survival paths of the remaining state according to the present invention, and the operations of other survival path computing units are the same as the operation of the survival path computing unit 150. The operation of the survival path computing units are represented by the following equation:

$$S_0^{n+1} = \begin{cases} [S_0^n, 00], & \text{if } P_0^n = \min(P_0^n, P_{3'}^n, P_{4'}^n) \\ [S_3^n, 10], & \text{if } P_{3'}^n = \min(P_0^n, P_{3'}^n, P_{4'}^n) \\ [S_4^n, 11], & \text{if } P_{4'}^n = \min(P_0^n, P_{3'}^n, P_{4'}^n) \end{cases}$$ Equations (14)

$$S_2^{n+1} = \begin{cases} [S_0^n, 00], & \text{if } P_0^n = \min(P_0^n, P_{3''}^n) \\ [S_3^n, 10], & \text{if } P_{3''}^n = \min(P_0^n, P_{3''}^n) \end{cases}$$

$$S_3^{n+1} = \begin{cases} [S_5^n, 11], & \text{if } P_5^n = \min(P_5^n, P_{2''}^n) \\ [S_2^n, 01], & \text{if } P_{2''}^n = \min(P_5^n, P_{2''}^n) \end{cases}$$

$$S_4^{n+1} = \begin{cases} [S_5^n, 11], & \text{if } P_5^n = \min(P_5^n, P_{2'}^n, P_{1''}^n) \\ [S_2^n, 01], & \text{if } P_{2'}^n = \min(P_5^n, P_{2'}^n, P_{1''}^n) \\ [S_1^n, 00], & \text{if } P_{1''}^n = \min(P_5^n, P_{2'}^n, P_{1''}^n) \end{cases}$$

$$S_5^{n+1} = \begin{cases} [S_5^n, 11], & \text{if } P_5^n = \min(P_5^n, P_{2'}^n, P_{1'}^n) \\ [S_2^n, 01], & \text{if } P_{2'}^n = \min(P_5^n, P_{2'}^n, P_{1'}^n) \\ [S_1^n, 00], & \text{if } P_{1'}^n = \min(P_5^n, P_{2'}^n, P_{1'}^n) \end{cases}$$

Next, the memory unit 154 memorizes the selected survival path outputted from the multiplexer 152 in the n-th operation timing. Then, the combinational circuit 156 connects the selected survival path $S_1$ of the n-th operation timing to the input bits "00" in series to generate a candidate survival path $[S_1, 00]$, which is utilized to generate other survival paths. In practice, there are two embodiments of the combinational circuit 156. In one embodiment, the combinational circuit stores a predetermined number of bits. When the combinational circuit receives two input bits, the oldest two bits are pushed out of the combinational circuit 156. In the second embodiment, the length of the bits stored in the combinational circuit is not limited. When the combinational circuit receives two input bits, the length of the stored bits increases. Please note that both embodiments of the combinational circuit 156 can be utilized in the present invention.

Figure 14:
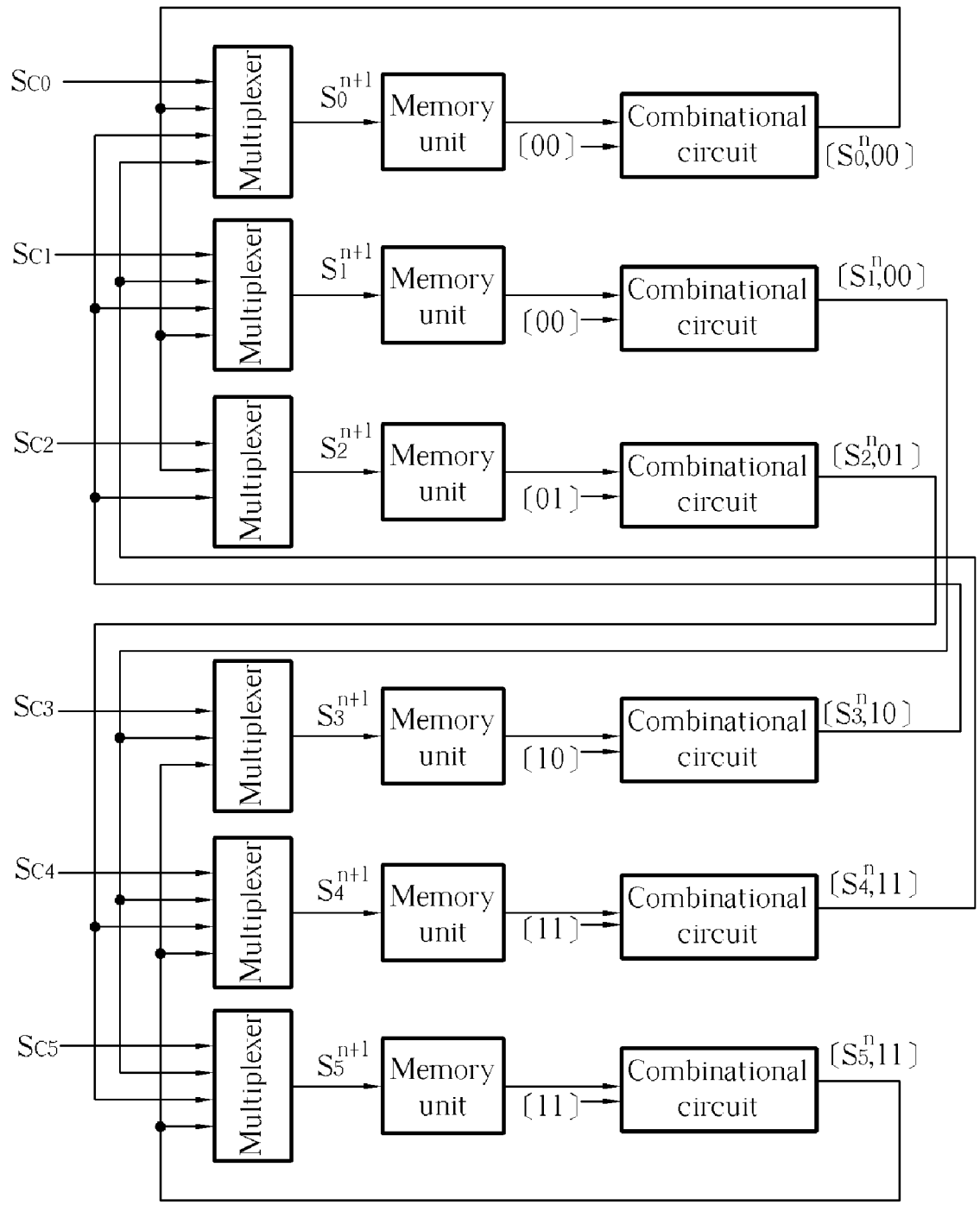
FIG. 14 is a schematic diagram of the relation between each survival path according to a preferred embodiment of the present invention.

Please refer to FIG. 14. FIG. 14 is a schematic diagram of the relation of each survival path as shown in Equation (13) and Equation (14). The control signals Sc0, Sc1, Sc2, Sc3, Sc4, Sc5 correspond to the comparators of each path metric computing unit. The operations and architectures of the multiplexer, the memory unit, and the combinational circuit are the same as the components of the same names shown in FIG. 10.

Figure 12:
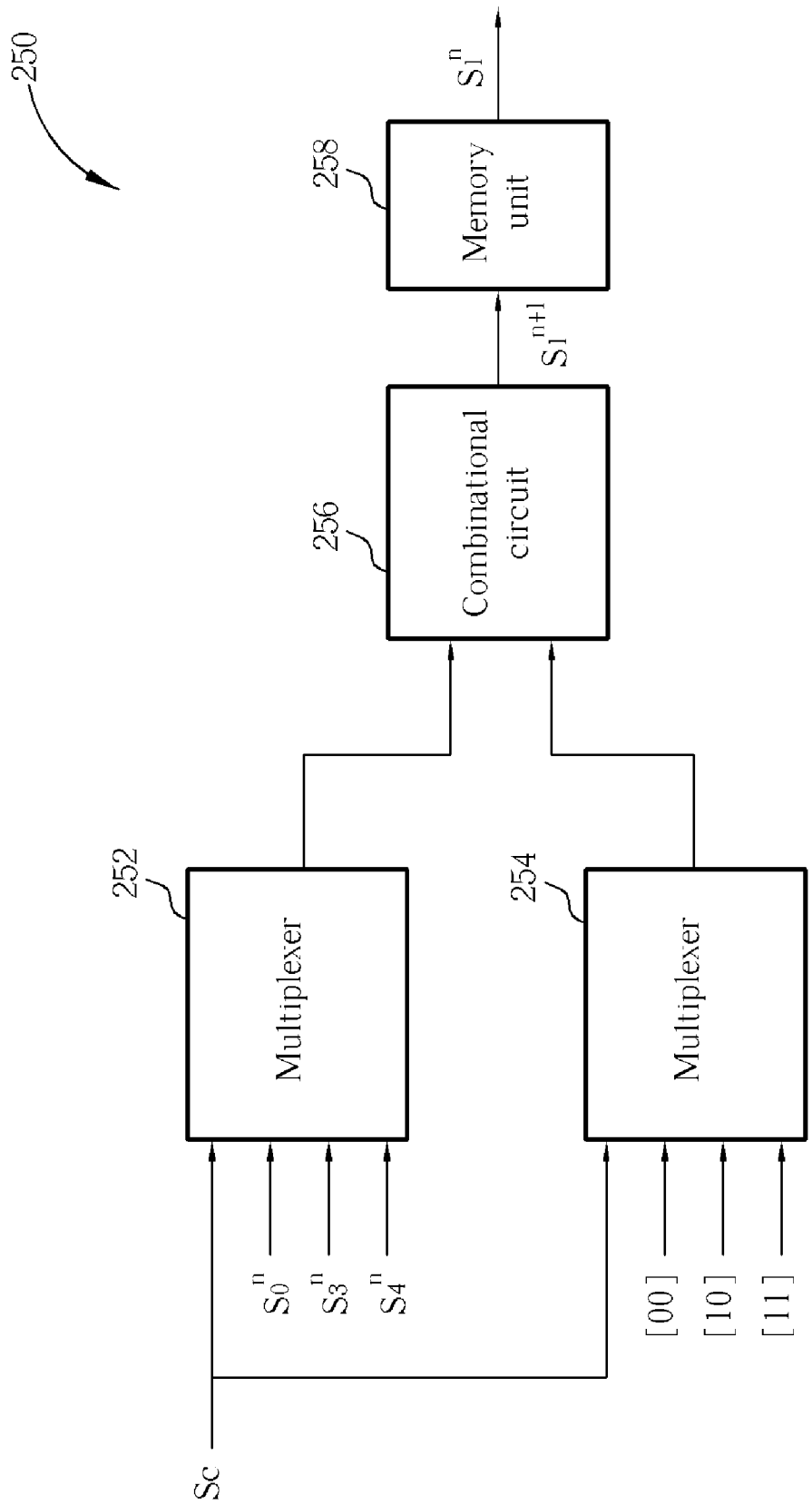
FIG. 12 is a schematic diagram of the survival path memory unit according to a preferred embodiment of the present invention.

Please refer to FIG. 12. FIG. 12 is a schematic diagram of the survival path memory unit 250 according to a preferred embodiment of the present invention. The new method is detailed in the following descriptions to generate the survival path $S_1$. The multiplexer 252 selects one of the survival paths $S_0^n$, $S_3^n$, $S_4^n$ generated in the previous operation timing according to the control signal Sc. The multiplexer 254 selects one from three sets of input bits [00], [10], [11] according to the control signal Sc. Next, the combinational circuit 256 generates a candidate survival path $S_1^{n+1}$ utilized in the next operation timing by connecting the selected survival path outputted by the multiplexer 252 to the selected input bits outputted by the multiplexer 254. In addition, the survival path $S_0$ corresponds to the input bits "00"; the survival path $S_3$ corresponds to the input bits "10"; and the survival path $S_4$ corresponds to the input bits "11".

Figure 13:
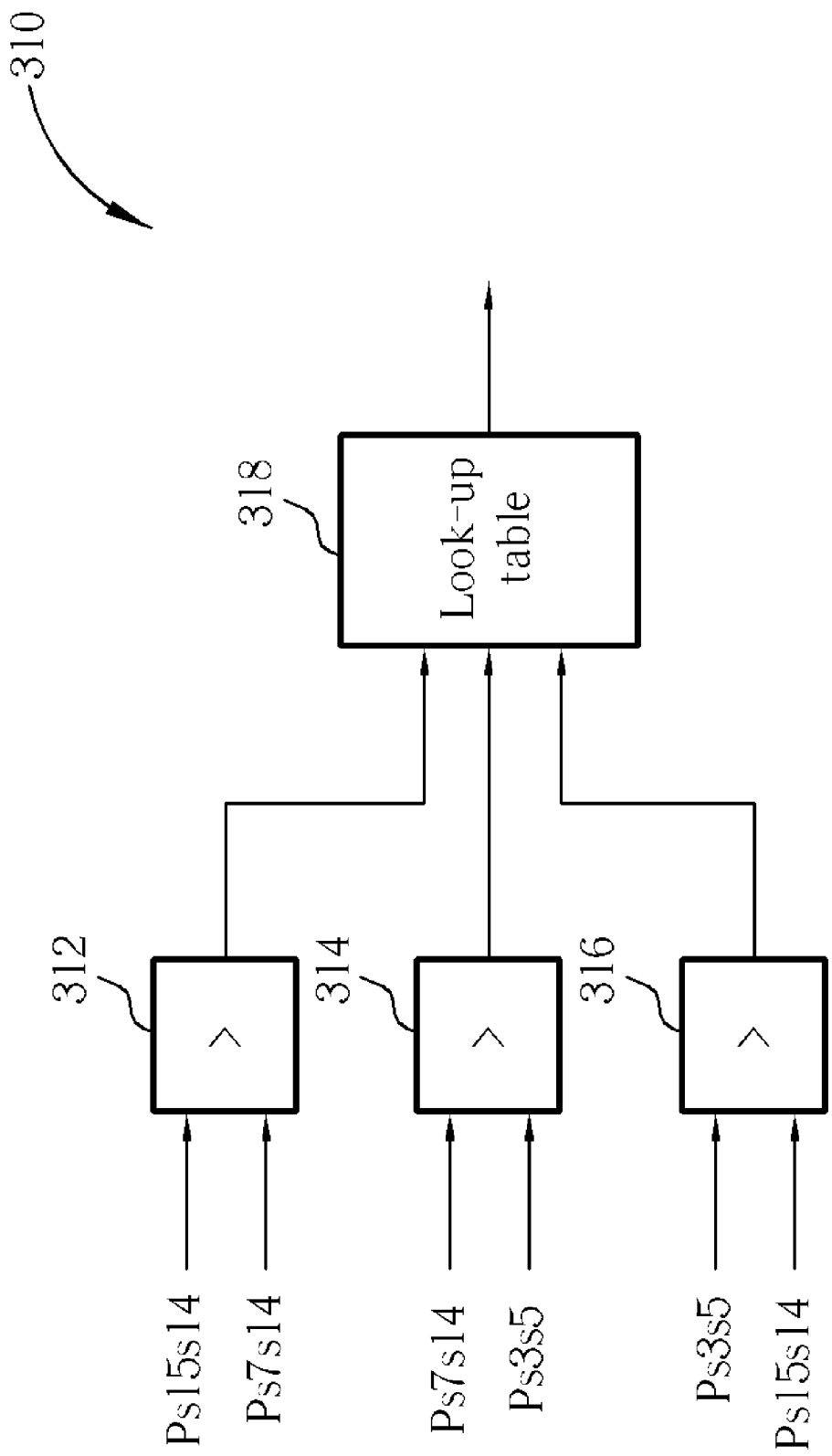
FIG. 13 is a schematic diagram of a high-speed comparator according to a preferred embodiment of the present invention.

Please note that the architectures of the comparators 31, 51, 61, 71, 131 having three inputs are not limited to the present embodiment. Please refer to FIG. 13. FIG. 13 is a schematic diagram of a high-speed comparator 310. As shown in FIG. 13, the comparator 310 utilizes three dual-input comparators 312, 314, 316 to compare two path metrics, and utilizes the comparison results to reference a look-up table, so as to generate the final comparison result of three path metrics. For example, as the relation between the path metrics is $P_{S15,S14} > P_{S7,S14}$, $P_{S7,S14} > P_{S3,S6}$, and $P_{S15,S14} > P_{S3,S6}$, the comparator 310 determines the minimum path metric is $P_{S3,S6}$. Any three-input comparator utilized in the present invention can be implemented as the comparator 310 shown in FIG. 13. As the architecture of the high-speed comparator is well known to those skilled in the art, a detailed description is omitted.

Please note that a key feature of the present invention is the algorithm for generating the input bits utilized to generate the survival path. When the Viterbi detector generates m (where m>1) bits in an operation timing, the corresponding input bits for generating the survival path are the left m bits of the name of the previous state. In the related art, the corresponding input bits are the right m bits of the name of the previous state. As a result, the present invention utilizes fewer memory units than the related art. For example, there are six states S0, S1, S2, S3, S4, and S5 according to the present embodiment, and the names of the states are represented by bits (000), (001), (011), (100), (110), and (111). Assume the length of each name is b bits (b=3). If b>m, the input bits for generating the survival path may be any m continuous bits in a bit stream. The bit stream is composed of the name of a previous state (b bits) and the name of a current state (b bits), wherein duplicate b−m bits (bits) in the name of a current state are removed. If m>b, the input bits for generating the survival path may be any m continuous bits in a bit stream. The bit stream is composed of the name of previous states (b bits), the name of a current state (b bits), and the excess bits (m−b bits). In other words, the bit stream is composed of the name of a previous state (b bits) and the newly inputted bits (m) located in the name of a current state. As a result, the memory requirement is reduced by selecting m continuous bits from the bit stream to be the corresponding input bits for generating the survival path. For example, assuming m=2, the previous state is S4 and the current state is S0. The bit stream is generated by (110) plus (000) and removing the duplicate bits "0" (i.e., left bit of the name of the previous state). Hence, the bit stream is (11000), and the length of the bit stream is equal to b+m=5. Following the above-mentioned example, the right m bits (00) of the bit stream are determined to be the corresponding input bits of a state according to the related art. However, the left m bits (11) of the bit stream are determined to be the corresponding input bits of a state according to the present invention as shown in FIG. 14.

In addition, the survival path generated by the Viterbi detector changes with the control signal Sc outputted by the path metric computing unit. When the Viterbi detector is operating, k input bits of the survival path remain. There are three methods of determining the m continuous bits: (1) determining i+1-th~i+m-th bits of the b+m bits long bit stream to be the corresponding input bits, wherein i=0, 1, 2, ..., b, and k=i; (2) determining the right m bits of the b+m bits long bit stream to be the corresponding input bits (i.e., i=b, and k=b); (3) determining the left m bits of the b+m bits long bit stream to be the corresponding input bits (i.e., i=0, and k=0). The method (2) is utilized by the related art. When l>m, the corresponding m input bits are equal to a part of the name of the current state and are independent to the control signal.

When i<=m, the corresponding m input bits comprise a part of the name of the previous state, and are dependent to the control signal.

In conclusion, compared with the path metric computing unit 70 shown in FIG. 9, the high-speed Viterbi detector 100 shown in FIG. 10 utilizes the path metric computing units 130, 140 to compute the path metrics $P_{1'}$ and $P_{1''}$ of the current state $S_1$, so as to perform the adding procedure and comparison procedure at the same time. As shown in FIG. 10, the path metric computing unit 130 generates the path metric $P_1$ by adding each path metric to the same branch cost. The path metrics $P_3$, $P_4$ of the previous states S3, S4 are adjusted to the path metrics $P_{3'}$ and $P_{4''}$, and the path metric $P_1$ of the current state S1 is also adjusted to the $P_{1'}$ and $P_{1''}$ utilized in the next operation timing. The definitions of the path metrics $P_{1'}$, $P_{1''}$ ... $P_{4'}$, $P_{4''}$ and the adjusted branch costs are represented by the following equations:

$$P_0^{n+1} = \min(P_0^n + {}_1B_{0,0}^n + {}_2B_{0,0}^n, P_3^n + {}_1B_{3,0}^n + {}_2B_{0,0}^n, P_4^n + {}_1B_{4,3}^n + {}_2B_{3,0}^n) \quad \text{Equation (15)}$$
$$= \min(P_0^n, P_3^n + {}_1B_{3,0}^n + {}_2B_{0,0}^n - ({}_1B_{0,0}^n + {}_2B_{0,0}^n), P_4^n + {}_1B_{4,3}^n + {}_2B_{3,0}^n - ({}_1B_{0,0}^n + {}_2B_{0,0}^n)) + {}_1B_{0,0}^n + {}_2B_{0,0}^n$$
$$= \min(P_0^n, P_3^n + {}_1B_{3,0}^n - {}_1B_{0,0}^n, P_4^n + {}_1B_{4,3}^n + {}_2B_{3,0}^n - ({}_1B_{0,0}^n + {}_2B_{0,0}^n)) + {}_1B_{0,0}^n + {}_2B_{0,0}^n$$
$$= \min(P_0^n, P_{3'}^n, P_{4'}^n) + {}_1B_{0,0}^n + {}_2B_{0,0}^n,$$
where $P_{3'}^n = (P_3^n + {}_1B_{3,0}^n - {}_1B_{0,0}^n, P_{4'}^n = P_4^n + {}_1B_{4,3}^n + {}_2B_{3,0}^n - ({}_1B_{0,0}^n + {}_2B_{0,0}^n))$ $$P_1^{n+1} = \min(P_0^n + {}_1B_{0,0}^n + {}_2B_{0,1}^n, P_3^n + {}_1B_{3,0}^n + {}_2B_{0,1}^n, P_4^n + {}_1B_{4,3}^n + {}_2B_{3,1}^n) \quad \text{Equation (16)}$$
$$= \min(P_0^n, P_3^n + {}_1B_{3,0}^n + {}_2B_{0,1}^n - ({}_1B_{0,0}^n + {}_2B_{0,1}^n), P_4^n + {}_1B_{4,3}^n + {}_2B_{3,1}^n - ({}_1B_{0,0}^n + {}_2B_{0,1}^n)) + {}_1B_{0,0}^n + {}_2B_{0,1}^n$$
$$= \min(P_0^n, P_3^n + {}_1B_{3,0}^n - {}_1B_{0,0}^n, P_4^n + {}_1B_{4,3}^n + {}_2B_{3,1}^n - ({}_1B_{0,0}^n + {}_2B_{0,1}^n)) + {}_1B_{0,0}^n + {}_2B_{0,1}^n$$
$$= \min(P_0^n, P_{3'}^n, P_{4''}^n) + {}_1B_{0,0}^n + {}_2B_{0,1}^n,$$
where $P_{4''}^n = (P_4^n + {}_1B_{4,3}^n + {}_2B_{3,1}^n - ({}_1B_{0,0}^n + {}_2B_{0,1}^n))$ $$P_2^{n+1} = \min(P_0^n + {}_1B_{0,1}^n + {}_2B_{1,2}^n, P_3^n + {}_1B_{3,1}^n + {}_2B_{1,2}^n) \quad \text{Equation (17)}$$
$$= \min(P_0^n, P_3^n + {}_1B_{3,1}^n + {}_2B_{1,2}^n - ({}_1B_{0,1}^n + {}_2B_{1,2}^n)) + {}_1B_{0,1}^n + {}_2B_{1,2}^n$$
$$= \min(P_0^n, P_3^n + {}_1B_{3,1}^n - {}_1B_{0,1}^n) + {}_1B_{0,1}^n + {}_2B_{1,2}^n$$
$$= \min(P_0^n, P_{3''}^n) + {}_1B_{0,1}^n + {}_2B_{1,2}^n,$$
where $P_{3''}^n = P_3^n + {}_1B_{3,1}^n - {}_1B_{0,1}^n$ $$P_3^n = \min(P_5^n + {}_1B_{5,4}^n + {}_2B_{4,3}^n, P_2^n + {}_1B_{2,4}^n + {}_2B_{4,3}^n) \quad \text{Equation (18)}$$
$$= \min(P_5^n, P_2^n + {}_1B_{2,4}^n + {}_2B_{4,3}^n - ({}_1B_{5,4}^n + {}_2B_{4,3}^n)) + {}_1B_{5,4}^n + {}_2B_{4,3}^n$$
$$= \min(P_5^n, P_2^n + {}_1B_{2,4}^n - {}_1B_{5,4}^n) + {}_1B_{5,4}^n + {}_2B_{4,3}^n$$
$$= \min(P_5^n, P_{2''}^n) + {}_1B_{5,4}^n + {}_2B_{4,3}^n,$$
where $P_{2''}^n = P_2^n + {}_1B_{2,4}^n - {}_1B_{5,4}^n$ $$P_4^{n+1} = \min(P_5^n + {}_1B_{5,5}^n + {}_2B_{5,4}^n, P_2^n + {}_1B_{2,5}^n + {}_2B_{5,4}^n, P_1^n + {}_1B_{1,2}^n + {}_2B_{2,4}^n) \quad \text{Equation (19)}$$
$$= \min(P_5^n, P_2^n + {}_1B_{2,5}^n + {}_2B_{5,4}^n - ({}_1B_{5,5}^n + {}_2B_{5,4}^n), P_1^n + {}_1B_{1,2}^n + {}_2B_{2,4}^n - ({}_1B_{5,5}^n + {}_2B_{5,4}^n)) + {}_1B_{5,5}^n + {}_2B_{5,4}^n$$
$$= \min(P_5^n, P_2^n + {}_1B_{2,5}^n - {}_1B_{5,5}^n, P_1^n + {}_1B_{1,2}^n + {}_2B_{2,4}^n - ({}_1B_{5,5}^n + {}_2B_{5,4}^n)) + {}_1B_{5,5}^n + {}_2B_{5,4}^n$$
$$= \min(P_5^n, P_{2'}^n, P_{1''}^n) + {}_1B_{5,5}^n + {}_2B_{5,4}^n,$$
wheer $P_{2'}^n = \min(P_2^n + {}_1B_{2,5}^n - {}_1B_{5,5}^n, P_{1''}^n = P_1^n + {}_1B_{1,2}^n + {}_2B_{2,4}^n - ({}_1B_{5,5}^n + {}_2B_{5,4}^n))$ $$P_5^{n+1} = \min(P_5^n + {}_1B_{5,5}^n + {}_2B_{5,5}^n, P_2^n + {}_1B_{2,5}^n + {}_2B_{5,5}^n, P_1^n + {}_1B_{1,2}^n + {}_2B_{2,5}^n) \quad \text{Equation (20)}$$
$$= \min(P_5^n, P_2^n + {}_1B_{2,5}^n + {}_2B_{5,5}^n - ({}_1B_{5,5}^n + {}_2B_{5,5}^n), P_1^n + {}_1B_{1,2}^n + {}_2B_{2,5}^n - ({}_1B_{5,5}^n + {}_2B_{5,5}^n)) + {}_1B_{5,5}^n + {}_2B_{5,5}^n$$
$$= \min(P_5^n, P_2^n + {}_1B_{2,5}^n - {}_1B_{5,5}^n, P_1^n + {}_1B_{1,2}^n + {}_2B_{2,5}^n - ({}_1B_{5,5}^n + {}_2B_{5,5}^n)) + {}_1B_{5,5}^n + {}_2B_{5,5}^n$$
$$= \min(P_5^n, P_{2'}^n, P_{1'}^n) + {}_1B_{5,5}^n + {}_2B_{5,5}^n,$$
where $P_{1'}^n = \min(P_1^n + {}_1B_{1,2}^n + {}_2B_{2,5}^n - ({}_1B_{5,5}^n + {}_2B_{5,5}^n))$ In Equation (20), $P_5^{n+1}$ denotes the path metric of the current state S5 utilized in the n+1-th operation timing, ${}_1B_{2,5}^n$ denotes the branch cost from previous state S2 to state S5, and ${}_2B_{5,5}^n$ denotes the branch cost from the state S5 to state S5. The naming method of other branch costs and path metrics utilized in Equation (15)~(19) is the same as the naming method of Equation (20). In addition, the formats of the Equation (15)~(20) can be adjusted to be:

$$P_0^{n+1} = \min(P_0^n, P_3^n, P_4^n) + {}_1B_{0,0}^n + {}_2B_{0,0}^n$$

$$P_{1'}^{n+1} = \min(P_0^n, P_3^n, P_4^n) + {}_1B_{0,0}^n + {}_2B_{0,1}^n + {}_1B_{1,2}^{n+1} + {}_2B_{2,5}^{n+1} - ({}_1B_{5,5}^{n+1} + {}_2B_{5,5}^{n+1})$$

$$P_{1''}^{n+1} = \min(P_0^n, P_3^n, P_4^n) + {}_1B_{0,0}^n + {}_2B_{0,1}^n + {}_1B_{1,2}^{n+1} + {}_2B_{2,4}^{n+1} - ({}_1B_{5,5}^{n+1} + {}_2B_{5,4}^{n+1})$$

$$P_{2'}^{n+1} = \min(P_0^n, P_3^n) + {}_1B_{0,1}^n + {}_2B_{1,2}^n + {}_1B_{2,5}^{n+1} - {}_1B_{5,5}^{n+1}$$

$$P_{2''}^{n+1} = \min(P_0^n, P_3^n) + {}_1B_{0,1}^n + {}_2B_{1,2}^n + {}_1B_{2,4}^{n+1} - {}_1B_{5,4}^{n+1}$$

$$P_{3'}^{n+1} = \min(P_5^n, P_{2''}^n) + {}_1B_{5,4}^n + {}_2B_{4,3}^n + {}_1B_{3,0}^{n+1} - {}_1B_{0,0}^{n+1}$$

$$P_{3''}^{n+1} = \min(P_5^n, P_{2''}^n) + {}_1B_{5,4}^n + {}_2B_{4,3}^n + {}_1B_{3,1}^{n+1} - {}_1B_{0,1}^{n+1}$$

$$P_{4''}^{n+1} = \min(P_5^n, P_{2''}^n, P_{1''}^n) + {}_1B_{5,5}^n + {}_2B_{5,4}^n + {}_1B_{4,3}^{n+1} + {}_2B_{3,0}^{n+1} - ({}_1B_{0,0}^{n+1} + {}_2B_{0,0}^{n+1})$$

$$P_{4''}^{n+1} = \min(P_5^n, P_{2'}^n, P_{1''}^n) + {}_1B_{5,5}^n + {}_2B_{5,4}^n + {}_1B_{4,3}^{n+1} + {}_2B_{3,1}^{n+1} - ({}_1B_{0,0}^{n+1} + {}_2B_{0,1}^{n+1})$$

$$P_5^{n+1} = \min(P_5^n, P_{2'}^n, P_{1''}^n) + {}_1B_{5,5}^n + {}_2B_{5,5}^n \quad \text{Equations (21)}$$

According to the Equation (21), the path metric computing units 130, 140 shown in FIG. 10 generate the path metrics $P_{1'}$ and $P_{1''}$, the branch cost computing unit 110 generates the $BC_1$ equal to $${}_1B_{0,0}^n + {}_2B_{0,1}^n + {}_1B_{1,2}^{n+1} + {}_2B_{2,5}^{n+1} - ({}_1B_{5,5}^{n+1} + {}_2B_{5,5}^{n+1})$$

, and the branch cost computing unit 120 generates the $BC_2$ equal to $${}_1B_{0,0}^n + {}_2B_{0,1}^n + {}_1B_{1,2}^{n+1} + {}_2B_{2,4}^{n+1} - ({}_1B_{5,5}^{n+1} + {}_2B_{5,4}^{n+1}).$$

Since other path metric computing units of the Viterbi detector generate the path metrics $P_0, P_{2'}, P_{2''}, \ldots, P_5$ according to Equation (21), the detailed description is omitted. According to Equation (21), the Viterbi detector 100 has ten path metric computing units for calculating all path metrics, but only has six survival path memory units. This is because the path metric computing units generating the path metrics $P_{1'}$ and $P_{1''}$ share one survival path memory unit. In the same manner, the path metric computing units generating the path metrics path metrics $P_{2'}$ and $P_{2''}$ share another survival path memory unit. Therefore the Viterbi detector 100 only utilizes six survival path memory units according to the present invention. As a result, the high-speed Viterbi detector 100 utilizes fewer path metrics and fewer survival path memory units to generate the path metrics of each current state according to the present invention.

In the embodiment mentioned above, the Viterbi detector processes two bits (m=2) in an operation timing. When the Viterbi detector computes the branch costs, the input signals of the Viterbi detector comprise first and second input bits in n-th operation timing and first and second input bits in n+1-th operation timing. Therefore the length of the input signal corresponds to 4 input timings and is greater than the length of the decoded bits corresponding to 2 input timings. In summary, the length of the decoded bits of the Viterbi detector is m, the length of the input signal utilized to generate the branch cost is q, and q>m according to the present invention. In addition, the length of the input signal to generate the branch costs is not identical. According to Equations (21), when computing the branch cost of the path metric $P_0$, the length of the input signal corresponds to two input timings; when computing the branch cost of the path metric $P_{1'}$, the length of the input signal corresponds to four input timings; and when computing the branch cost of the path metric $P_{2'}$, the length of the input signal corresponds to three input timings. As a result, q is the total length of the related input signal for computing all branch costs.

Compared with the Viterbi detector generating 2 decoded bits in an operation timing according to the present embodiment, the Viterbi detector is capable of decoding 1 bit or more than two bits according to the present invention. When decoding 1 bit, the operation of generating the path metrics is represented by the following equations:

$$P_0^{n+1} = \min(P_0^n, P_{3'}^n) + B_{0,0}^n \quad \text{Equations (22)}$$

$$P_1^{n+1} = \min(P_0^n, P_{3''}^n) + B_{0,1}^n$$

$$P_{2'}^{n+1} = P_1^n + B_{1,2'}^n$$

$$P_{2''}^{n+1} = P_1^n + B_{1,2''}^n$$

-continued $$P_{3'}^{n+1} = P_4^n + B_{4,3'}^n$$

$$P_{3''}^{n+1} = P_4^n + B_{4,3'}^n$$

$$P_4^{n+1} = \min(P_5^n, P_{2''}^n) + B_{5,4}^n$$

$$P_5^{n+1} = \min(P_5^n, P_{2'}^n) + B_{5,5}^n, \text{ wherein}$$

$$B_{4,3'}^n = B_{4,3}^n + (B_{3,0}^{n+1} - B_{0,0}^{n+1})$$

$$B_{4,3''}^n = B_{4,3}^n + (B_{3,1}^{n+1} - B_{0,1}^{n+1})$$

$$B_{1,2'}^n = B_{1,2}^n + (B_{2,5}^{n+1} - B_{5,5}^{n+1})$$

$$B_{1,2''}^n = B_{1,2}^n + (B_{2,4}^{n+1} - B_{5,4}^{n+1})$$

The operation of generating the survival path is represented by the following equations:

$$S_0^{n+1} = \begin{cases} [S_0^n, 0] & \text{, if } (P_0^n < P_{3'}^n) \\ [S_3^n, 1] & \text{, else} \end{cases} \quad \text{Equations (23)}$$

$$S_1^{n+1} = \begin{cases} [S_0^n, 0] & \text{, if } (P_0^n < P_{3''}^n) \\ [S_3^n, 1] & \text{, else} \end{cases}$$

$$S_2^{n+1} = [S_1^n, 0]$$

$$S_3^{n+1} = [S_4^n, 1]$$

$$S_4^{n+1} = \begin{cases} [S_5^n, 1] & \text{, if } (P_5^n < P_{2''}^n) \\ [S_2^n, 0] & \text{, else} \end{cases}$$

$$S_5^{n+1} = \begin{cases} [S_5^n, 1] & \text{, if } (P_5^n < P_{2'}^n) \\ [S_2^n, 0] & \text{, else} \end{cases}$$

According to the present invention, the input bit following the survival path is the first bit of the name of the previous state, though the related art utilizes the last bit of the name of the previous state as the input bit. As a result, the present invention reduce the memory consuming by selecting a bit located between the first bit and the last bit of the name of the previous states to be the input bit to generate the survival path.

Compared with the related art, the path metric computing unit utilizes the parallel architecture to reduce the computation time, and utilizes the retiming technique, the algorithms of the Moore state machine, and the algorithms of the Mealy state machine to simplify the operation of generating the branch costs and reducing the number of states utilized. As a result, the circuit complexity is reduced accordingly. Furthermore, the survival path memory unit utilizes less memory than the related art according to the present invention. Therefore, the present invention improves the performance and reduces the manufacturing cost at the same time. Please note that the number of input bits for generating the survival path is not limited to the embodiment mentioned above, and can be any number greater than one.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A path metric computing unit applied in a Viterbi detector, for generating a first path metric according to a plurality of previous path metrics and a first branch cost, wherein the Viterbi detector receives an input signal, then generates a detecting result based on the input signal, and computes the first branch cost according to at least two input signals corresponding to at least two input timings, the path metric computing unit comprising:
- a comparator for generating a control signal according to the previous path metrics, wherein the control signal corresponds to the best of the previous path metrics;
- a first combinational circuit for generating a plurality of first candidate path metrics according to the previous path metrics and the first branch cost;
- a first multiplexer, electrically connected to the comparator and the first combinational circuit, for determining the first path metric according to the control signal and the first candidate path metrics;
- a second combinational circuit for generating a plurality of second candidate path metrics according to each previous path metric and a second branch cost; and
- a second multiplexer, electrically connected to the comparator and the second combinational circuit, for determining the second path metric according to the control signal and the second candidate path metrics.

2. The path metric computing unit of claim 1, wherein the first combinational circuit comprises:
a plurality of adders for adding each previous path metric to the first branch cost.

3. The path metric computing unit of claim 1, wherein the first multiplexer selects the best of the first candidate path metrics as the first path metric according to the control signal.

4. The path metric computing unit of claim 1 further comprising a first register and a second register, electrically connected to the first and second multiplexer, respectively, for retaining the first path metric and the second path metric as previous path metrics at next operation timing.

5. The path metric computing unit of claim 1 further comprising a survival path memory unit, electrically connected to the first multiplexer, for storing a survival path corresponding to the first path metric, wherein the survival path also corresponds to the second path metric.

6. The path metric computing unit of claim 1, wherein the comparator comprises a plurality of dual-input comparators and a lookup table, each dual-input comparator generates an output signal according to magnitude of two input signals and the comparator generates the control signal by inquiring the lookup table with a plurality of output signals of the dual-input comparators.

7. The path metric computing unit of claim 1, wherein branches between the previous states with the previous path metrics and the current state with the first path metric have the same first branch cost.

8. A Viterbi detector for processing m input bits in an operation timing, wherein m>=1, the Viterbi detector comprising:
- a path metric computing unit for computing a path metric of a current state, and for generating a control signal; and
- a survival path memory unit for storing a survival path corresponding to the current state, the survival path memory unit comprising:
  - a first multiplexer for selecting one of a plurality of candidate survival paths corresponding to the current state as the survival path according to the control signal;
  - a second multiplexer for selecting one of a plurality of sets of input bits according to the control signal;
  - a combinational circuit, electrically connected to the first and the second multiplexers, for connecting the selected candidate survival path of the first multiplexer and the selected set of input bits of the second multiplexer in series to form a candidate survival path utilized at a next operation timing; and
  - a memory unit, electrically connected to the combinational circuit, for storing the candidate survival path outputted by the combinational circuit;

wherein m latest bits of the survival path comprise a part of a previous state selected according to the control signal.

9. A Viterbi detector for processing m input bits at a single operation timing, wherein m>=1, the Viterbi detector comprising:
- a first branch cost computing unit (BMU) for computing a first branch cost of a current state;
- a second branch cost computing unit for computing a second branch cost of the current state;
- a first path metric computing circuitry, electrically connected to the first branch cost computing unit, for generating a first path metric of the current state according to a plurality of previous path metrics corresponding to the current state and the first branch cost;
- a second path metric computing circuitry, electrically connected to the second branch cost computing unit, for generating a second path metric of the current state according to the plurality of previous path metrics and the second branch cost; and
- a survival path memory circuitry for storing a survival path corresponding to the current state;

wherein the length of a related input signal for calculating the first and second branch costs at a single operation timing is q input timings, each of the q input timings corresponds to at least an input bit of the related input signal, and q is greater than m.

10. The Viterbi detector of claim 9, wherein the first branch cost computing unit and the second branch cost computing unit generate a first branch cost and a second branch cost, respectively, according to a received signal and a desired signal of the current state, and the length of the desired signal is equal to q, and q>m.

11. The Viterbi detector of claim 9, wherein the first path metric computing circuitry comprises:
- a first comparator for generating a control signal by comparing the plurality of previous path metrics, wherein the control signal corresponds the best of a plurality of path metrics of a plurality of previous states;
- a first combinational circuit for generating a plurality of first output values according to the plurality of path metrics of the previous states and the first branch cost; and
- a first multiplexer, electrically connected to the first comparator and the first combinational circuit, for determining the first path metric according to the control signal and the first output values.

12. The Viterbi detector of claim 11, wherein the second path metric computing circuitry comprises:
- a second combinational circuit for generating a plurality of second output values by adding each path metric of a previous state to the second branch cost; and
- a second multiplexer, electrically connected to the first comparator and the second combinational circuit, for determining the second path metric according to the control signal and the second output values.

13. The Viterbi detector of claim 11, wherein the control signal is utilized for controlling the first multiplexer to select the best of the plurality of first output values of the first combinational circuit to be the first path metric.

14. The Viterbi detector of claim 12, wherein the control signal is utilized for controlling the second multiplexer to select the best of the second output values of the second combinational circuit to be the second path metric.

15. The Viterbi detector of claim 9, wherein the survival path memory circuitry comprises:
a multiplexer for selecting one of a plurality of candidate survival paths of a plurality of previous states corresponding to the current states according to the control signal, and the selected candidate survival path is determined to be the survival path;
a memory unit, electrically connected to the multiplexer, for storing the selected candidate survival path; and
a combinational circuit, electrically connected to the memory unit, for connecting the survival path of the current state and a set of input bits corresponding to the current state in series.

16. A path metric computing method applied in a Viterbi detector, for generating a first path metric according to a plurality of previous path metrics and a first branch cost, wherein the Viterbi detector receives an input signal, then generates a detecting result based on the input signal, and computes the first branch cost according to at least two input signals corresponding to at least two input timings, the path metric computing method comprising:
generating a control signal by comparing the previous path metrics of, wherein the control signal corresponds to the best of the previous path metrics;
generating a plurality of first candidate path metrics according to the previous path metrics and the first branch cost;
determining the first path metric according to the control signal and the first candidate path metrics;
generating a plurality of second candidate path metrics according to each previous path metric and a second branch cost; and
determining the second path metric according to the control signal and the second candidate path metrics.

17. The path metric computing method of claim 16, wherein the step of generating the plurality of first candidate path metrics comprises:
adding each previous path metric to the first branch cost.

18. The path metric computing method of claim 16, wherein the step of determining the first path metric comprises:
selecting the best of the first candidate path metrics as the first path metric according to the control signal.

19. The path metric computing method of claim 16 further comprising:
retaining the first path metric and the second path metric as previous path metrics utilized at the next operation timing.

20. The path metric computing method of claim 16 further comprising:
utilizing a survival path memory unit to store a survival path corresponding to the first path metric, wherein the survival path also corresponds to the second path metric.

21. The path metric computing method of claim 16, wherein the step of comparing the plurality of previous path metrics comprises:
comparing each pair of previous path metrics; and
generating the control signal by referencing the lookup table with the comparison result.

22. The path metric computing method of claim 16, wherein branches between the previous states with the previous path metrics and the current state with the first path metric have the same first branch cost.

23. A Viterbi detecting method for processing m input bits at an operation timing, wherein m>=1, the Viterbi detecting method comprising:
computing a first branch cost of a current state;
computing a second branch cost of the current state;
generating a first path metric of the current state according to a plurality of previous path metrics corresponding to the current state and the first branch cost;
generating a second path metric of the current state according to the plurality of previous path metrics and the second branch cost; and
generating and storing a survival path corresponding to the current state;
wherein a length of a related input signal for calculating the first and second branch costs at a single operation timing is q input timing, each of the q input timings corresponds to at least an input bit of the related input signal, and q is greater than m.

24. The Viterbi detecting method of claim 23, wherein the step of generating the first branch cost comprises:
utilizing a received signal and a desired signal of the current state to generate the first branch cost;
and the step of generating the second branch cost comprises:
utilizing the received signal and a desired signal of the current state to generate the second branch cost;
wherein the total length of the desired signal is equal to q input timings corresponding to a single operation timing, and q>m.

25. The Viterbi detecting method of claim 23, wherein the step of computing the first path metric comprises:
a first comparator for generating a control signal by comparing the plurality of previous path metrics, wherein the control signal corresponds the best of a plurality of previous path metrics;
generating a plurality of first output values according to the plurality of previous path metrics and the first branch cost;
determining the first path metric according to the control signal and the first output values.

26. The Viterbi detecting method of claim 25, wherein the step of determining the first path metric comprises:
selecting the best of the plurality of first output values according to the control signal.

27. The Viterbi detecting method of claim 23, wherein the step of generating the second path metric comprises:
generating a plurality of second output values by utilizing a plurality of previous path metrics and the second branch cost; and
determining the second path metric according to the control signal and the second output values.

28. The Viterbi detecting method of claim 27, wherein the step of determining the second path metric comprises:
selecting the best of the plurality of second output values according to the control signal.

29. The Viterbi detecting method of claim 23, wherein the step of generating the survival path comprises:
selecting one of a plurality of candidate survival paths of a plurality of previous states corresponding to the current states according to the control signal, then connecting the selected candidate survival path and a set of input bits corresponds to the previous state, and the connecting result corresponding to the survival path of the current state;
storing the survival path; and
connecting the survival path of the current state with a set of input bits corresponding to the current state in series.

* * * * *